(12) United States Patent
Bolouri-Saransar et al.

(10) Patent No.: US 9,595,771 B2
(45) Date of Patent: Mar. 14, 2017

(54) COMMUNICATION PLUG WITH IMPROVED CROSSTALK

(71) Applicant: Panduit Corp., Tinley Park, IL (US)

(72) Inventors: Masud Bolouri-Saransar, Orland Park, IL (US); Ronald A. Nordin, Naperville, IL (US); Paul W. Wachtel, Arlington Heights, IL (US); Surendra Chitti Babu, New Lenox, IL (US)

(73) Assignee: Panduit Corp., Tinley Park, IL (US)

( * ) Notice: Subject to any disclaimer, the term of this patent is extended or adjusted under 35 U.S.C. 154(b) by 53 days.

(21) Appl. No.: 14/202,166

(22) Filed: Mar. 10, 2014

(65) Prior Publication Data

US 2014/0187077 A1    Jul. 3, 2014

Related U.S. Application Data

(63) Continuation of application No. 12/909,030, filed on Oct. 21, 2010, now Pat. No. 8,690,598.

(51) Int. Cl.
| | |
|---|---|
| *H01R 4/50* | (2006.01) |
| *H01R 4/24* | (2006.01) |
| *H01R 13/6469* | (2011.01) |
| *H01R 11/20* | (2006.01) |
| *H01R 13/719* | (2011.01) |
| *H01R 24/64* | (2011.01) |

(52) U.S. Cl.
CPC ............. *H01R 4/24* (2013.01); *H01R 11/20* (2013.01); *H01R 13/6469* (2013.01); *H01R 13/719* (2013.01); *H01R 24/64* (2013.01)

(58) Field of Classification Search
CPC .... H01R 24/64; H01R 24/62; H01R 13/6461; H01R 4/2429; H01R 13/6658; H01R 13/26; H01R 12/675
USPC .............. 439/418, 404, 676, 941, 76.1, 344
See application file for complete search history.

(56) References Cited

U.S. PATENT DOCUMENTS

| | | | |
|---|---|---|---|
| 4,601,530 A | 7/1986 | Coldren et al. | |
| 4,636,024 A | 1/1987 | Yahata | |
| 4,737,122 A | 4/1988 | Dechelette | |
| 4,875,875 A * | 10/1989 | Archer | H01R 4/2433 439/401 |

(Continued)

FOREIGN PATENT DOCUMENTS

| | | |
|---|---|---|
| CN | 1294766 A | 5/2001 |
| CN | 101595536 A | 12/2009 |

(Continued)

*Primary Examiner* — Xuong Chung Trans
(74) *Attorney, Agent, or Firm* — Christopher S. Clancy; James H. Williams; Yuri Astvatsaturov

(57) ABSTRACT

A communication plug having a plug body and a plurality of contact pairs at least partially within the plug body, the contact pairs including an inherent asymmetric coupling between individual contacts of one of the contact pairs and other individual contacts of another of the contact pairs. Second asymmetric coupling elements are connected between the individual contacts of one of the contact pairs and the other individual contacts of another of the contact pairs. The second asymmetric coupling elements, when combined with the inherent asymmetric coupling, provide a balanced symmetric coupling between the individual contacts of one of the contact pairs and the other individual contacts of another of the contact pairs.

7 Claims, 22 Drawing Sheets

(56) References Cited

U.S. PATENT DOCUMENTS

| | | | |
|---|---|---|---|
| 5,071,219 A | 12/1991 | Yurtin et al. | |
| 5,203,717 A | 4/1993 | Beck et al. | |
| 5,211,576 A | 5/1993 | Tonkiss et al. | |
| 5,284,447 A | 2/1994 | Kristiansen | |
| 5,403,202 A * | 4/1995 | Roehling | H05K 1/118 439/493 |
| 5,494,457 A | 2/1996 | Kunz | |
| 5,505,638 A | 4/1996 | Su et al. | |
| 5,562,479 A | 10/1996 | Pallas et al. | |
| 5,571,035 A * | 11/1996 | Ferrill | H01R 24/64 439/676 |
| 5,573,423 A | 11/1996 | Lin et al. | |
| 5,628,647 A | 5/1997 | Rohrbaugh et al. | |
| 5,999,400 A | 12/1999 | Belopolsky et al. | |
| 6,042,427 A * | 3/2000 | Adriaenssens et al. | 439/676 |
| 6,116,943 A * | 9/2000 | Ferrill et al. | 439/418 |
| 6,270,358 B1 * | 8/2001 | Nozick | 439/76.1 |
| 6,383,029 B1 | 5/2002 | Bolouri-Saransar | |
| 6,386,913 B1 | 5/2002 | Mohammad et al. | |
| 6,406,325 B1 * | 6/2002 | Chen | H01R 13/6463 439/344 |
| 6,431,887 B1 | 8/2002 | Yeomans et al. | |
| 6,506,077 B2 | 1/2003 | Nagel | |
| 6,520,808 B2 | 2/2003 | Forbes et al. | |
| 6,955,557 B2 * | 10/2005 | Bernat | H01R 43/015 439/404 |
| 7,001,204 B1 * | 2/2006 | Lin | 439/418 |
| 7,179,115 B2 | 2/2007 | Hashim | |
| 7,556,536 B2 | 7/2009 | Caveney et al. | |
| 7,572,140 B2 | 8/2009 | Szelag et al. | |
| 7,604,515 B2 * | 10/2009 | Siemon et al. | 439/676 |
| 7,815,462 B2 | 10/2010 | Boeck et al. | |
| 7,837,513 B2 * | 11/2010 | Millette | H01R 13/6466 439/676 |
| 7,883,354 B1 * | 2/2011 | Ma et al. | 439/418 |
| 8,050,045 B2 | 11/2011 | Okuzawa et al. | |
| 8,764,476 B1 * | 7/2014 | Ma | H01R 4/2433 439/418 |
| 9,318,840 B2 * | 4/2016 | Siev | H01R 13/582 |
| 2004/0157493 A1 | 8/2004 | Bergner et al. | |
| 2006/0014410 A1 * | 1/2006 | Caveney | H01R 13/6658 439/188 |
| 2006/0172608 A1 | 8/2006 | Caveney | |

FOREIGN PATENT DOCUMENTS

| | | |
|---|---|---|
| CN | 101604809 A | 12/2009 |
| EP | 1006623 A2 | 6/2000 |
| EP | 2133960 A2 | 12/2009 |
| WO | 2008069968 A2 | 6/2008 |

* cited by examiner

COMMUNICATION PLUG WITH IMPROVED CROSSTALK

CROSS REFERENCE TO RELATED APPLICATIONS

This application is a continuation of U.S. application Ser. No. 12/908,030, filed Oct. 21, 2010, the entire disclosure of which are hereby incorporated by reference.

FIELD OF THE INVENTION

The present disclosure relates generally to communication plugs with improved crosstalk, and more particularly, to communication plugs with balanced crosstalk.

BACKGROUND OF THE INVENTION

The current ANSI/TIA-568-C.2 structured cabling standard defines the requirements for component and channel operation from Category 5e (CAT5E) to Category 6A (CAT6A), including requirements for RJ45 type plugs such as are commonly used in communication networks. Such plugs typically are connected to respective four-twisted-pair communication cables, and can mate with RJ45 jacks in a variety of network equipment such as patch panels, wall jacks, Ethernet switches, routers, servers, physical layer management systems, power-over-Ethernet equipment, security devices (including cameras and sensors), and door access equipment. RJ45 plugs can also mate with RJ45 jacks in workstation peripherals, such as telephones, fax machines, computers, printers, copiers, and other equipment. Plugs are components in corresponding channels, which channels can connect a user's computer to a router, for example, providing connection to the Internet, or other local area network (LAN) devices.

A typical structured cabling environment can include a commercial building having offices/work areas with computer workstations which are connected to a LAN, and to the Internet via patch panels, wall jacks, Ethernet switches, routers, servers, and/or physical layer management systems. A variety of cabling/cords such as patch cords, zone cords, backbone cabling, and horizontal cabling are used throughout the building to interconnect the aforementioned equipment. Cabinets, racks, cable management, overhead routing systems, and other such equipment can be used to organize the equipment and cabling into a manageable system.

As the complexity, data rate and frequency of operation increase for such communication networks, so increases the potential for undesirable interactions between the different channel components such as plugs, jacks and cable. As with any communication system, these communication networks have minimum signal-to-noise requirements to reliably transmit and receive information sent through the channel. A channel in such systems includes the four-twisted-pair (four transmission lines) transmission medium operating in full duplex communication mode. For 10 gigabit Ethernet (CAT6A), for example, each twisted pair (circuit) is operating at 2.5 gigabit/s to give the corresponding channel the full 10 gigabit capacity. One form of noise in such channels is crosstalk, which is a disturbance in a circuit (or a cable pair) signal, caused by a signal in an adjacent circuit (cable pair).

Crosstalk can be characterized as occurring at the near-end (NEXT) and the far-end (FEXT) of a transmission line between differential conductive path pairs within a channel (referred to as internal NEXT and internal FEXT) or can couple to differential conductive path pairs in a neighboring channel (referred to as alien NEXT and alien FEXT). Because of the differential signals which are typically used in such communication systems, so long as the same noise signal (common mode noise) is added to each conductive path in the conductive path pair, then the voltage difference between the conductive paths remains the same and such common mode crosstalk has no effect on the differential signal, for a given twisted pair.

As data transmission rates have steadily increased, crosstalk due to capacitive and inductive couplings, due at least in part to the distributed electrical parameters of the various circuit components, among the closely spaced parallel conductors within the plug and/or jack has become increasingly problematic. If the capacitive and inductive couplings between the four pairs of a channel are not equal, an imbalance exists, and the consequence of such imbalance is phenomenon called mode conversion. In mode conversion, common mode noise is converted to a differential signal, and the differential signal can be converted to a common mode signal. What may have been a relatively harmless common mode signal from a nearby channel, in the presence of circuit imbalance in the victim channel, is converted to differential signal in the victim channel thereby detrimentally reducing the signal to noise ratio of the victim channel. FIGS. 1A and 1B show a typical communication plug, with the plug body shown translucent to illustrate internal wires and contacts. FIG. 1A is an upper right-hand perspective view and FIG. 1B is an upper plan view. The plug 100 includes an RJ45 plug body 102 and a strain relief boot 114. Four differential wire pairs 108 (108a, 108b, 108c, and 108d) are disposed within the plug body.

During a typical installation, the pairs 108 are untwisted, aligned into the plug body 102, and crimped with a handheld tool so that the pairs 108 make contact with the insulation piercing contacts (IPCs) 109 at the nose of the plug. The IPCs provide the connection point when the plug 100 is inserted into an RJ45 jack. Although this design is per the ANSI/TIA-568-C.2 structured cabling standard, this design results in unbalanced capacitive and inductive coupling between neighboring conductors in the IPC area and along the untwisted parallel portion of the wires within the plug body 102. For interoperability and backwards compatibility, ANSI/TIA-568-C.2 requires that the plug have internal crosstalk within a de-embedded range, and that contacts 1 through 8 are arranged in order with contact 1 adjacent to contact 2, which is adjacent to contact 3, etc. This orientation of contacts results in an inherently unequal amount of coupling between the conductors of each pair. Capacitive and inductive coupling between neighboring circuits is highly dependent on proximity, i.e., the closer a victim circuit is to an aggressor circuit the higher the coupling, and consequently, the greater the coupled signal in the victim circuit. The capacitive and inductive coupling between conductor 3 of pair 3-6 and conductor 2 of pair 1-2 is much stronger than the capacitive and inductive coupling between conductor 3 of pair 3-6 and conductor 1 of pair 1-2 due to the closer proximity between conductor 2 of pair 1-2 and conductor 3 of pair 3-6. This poor balance leads to mode conversion, which causes a portion of a differential signal propagating through the plug on pair 1-2 to be converted to a common mode signal on pair 1-2. Due to the reciprocal nature of mode conversion, a portion of any common mode signal propagating though the plug on pair 1-2 will be converted to a differential signal on pair 1-2. The negative impact from poor balance and the associated mode conversion in the RJ45 plug 100 can be seen in many of the measurements made on a Category 6A channel, such as alien crosstalk parameters (e.g. power sum alien near-end crosstalk (PSANEXT) and power sum alien attenuation to crosstalk ratio, far-end (PSAACRF)) and balance parameters (e.g. transverse conversion loss (TCL) and transverse conversion transfer loss (TCTL)). The manufacturing inconsistencies of the manual untwisting process mentioned above can also lead to performance variability.

Poor balance in the plug 100 and the corresponding mode conversion may also lead to degraded electromagnetic interference/electromagnetic compatibility (EMI/EMC) performance for a Category 6A channel. The common mode signal that is created from a differential signal passing through an unbalanced plug 100 will radiate into the surrounding environment. Higher mode conversion corresponds to greater radiated energy. Conversely, when a channel is subjected to electromagnetic interference from outside sources such as walkie talkies, cellphones, etc., a common mode signal is induced in the channel. When that common mode signal passes through an unbalanced plug 100, a portion of that signal is converted to a differential signal, which will contribute to the total noise in the channel. Higher mode conversion results in proportionally higher differential noise.

Another shortcoming of the typical RJ45 plug 100 relates to the "super-pair" phenomenon. Industry standards require the plug contacts to have contacts 3 and 6 split around contacts 4 and 5. In the plug 100, wire pair 3-6 (reference numeral 108b) is also split around wire pair 4-5 (reference numeral 108c). This splitting of wire pair 3-6 results in conductor 3 coupling more strongly than conductor 6 to pair 1-2 (reference numeral 108a) and conductor 6 coupling more strongly than conductor 3 to pair 7-8 (reference numeral 108d). Because the signal on conductor 3 is at the opposite polarity of the signal on conductor 6, pair 1-2 will be at the opposite polarity of pair 7-8. Depending on the design of the connecting hardware and cabling, pair 1-2 and pair 7-8 may act as a differential "super-pair" and propagate the crosstalk from pair 3-6 through the channel. The "super-pair" signal can degrade the PSANEXT and PSAACRF performance of a Category 6A channel.

What is needed in the art is a communication plug which has balanced coupling between pairs resulting in balanced crosstalk between the four pairs, which can provide improved PSANEXT, PSAACRF, TCL, and/or TCTL performance as well as enhanced EMI/EMC performance caused by lowered electromagnetic radiation and higher tolerance of electromagnetic field levels from interfering sources.

SUMMARY OF THE INVENTION

The invention comprises, in one form thereof, a communication plug that makes electrical contact between a communication cable and a communication jack. The plug includes a plug body, a circuit board, contacts for the cable, and contacts for a jack. The plug body has a cavity for receiving the communication cable, where the communication cable enters the plug body along an axis. The circuit board is located in the cavity and has a plurality of traces arranged to provide coupling between at least two of the plurality of traces. The circuit board has at least one surface that is angled relative to the axis.

The angled surface of the circuit board may be implemented by installing the circuit board at an angle in the cavity of the plug body, for example. Alternatively, the circuit board may be placed on a molded body having an angled surface relative to the axis. For example, the circuit board may be a flexible printed circuit board wrapped around the molded body.

Common mode chokes may be included on the circuit board for each wire pair. This can help to attenuate common mode signals that may be propagating on the wire pairs, without significantly attenuating differential signals.

The invention comprises, in another form thereof, a communication plug for making electrical contact between a communication cable with a plurality of cable conductor pairs and a communication jack, which includes a plug body having a cavity for receiving the communication cable, and a plurality of contact pairs at least partially within the plug body. The plurality of contact pairs make electrical contact with corresponding cable conductor pairs, wherein at least one contact of the contact pairs is approximately equidistant to both contacts of another of the contact pairs.

The invention comprises, in another form thereof, a communication plug having a plug body and a plurality of contact pairs at least partially within the plug body, the contact pairs including an inherent asymmetric coupling between individual contacts of one of the contact pairs and other individual contacts of another of the contact pairs. Second asymmetric coupling elements are connected between the individual contacts of one of the contact pairs and the other individual contacts of another of the contact pairs. The second asymmetric coupling elements, when combined with the inherent asymmetric coupling, provide a balanced symmetric coupling between the individual contacts of one of the contact pairs and the other individual contacts of another of the contact pairs.

The invention comprises, in another form thereof, a communication system including a communication cable and/or communication equipment. A communication plug is connected to the communication cable and/or the communication equipment. The communication plug includes a plug body and a plurality of contact pairs at least partially within the plug body, the contact pairs having an inherent asymmetric coupling between individual contacts of one of the contact pairs and other individual contacts of another of the contact pairs. Second asymmetric coupling elements are connected between the individual contacts of one of the contact pairs and the other individual contacts of another of the contact pairs. The second asymmetric coupling elements, when combined with the inherent asymmetric coupling, provide a balanced symmetric coupling between the individual contacts of one of the contact pairs and the other individual contacts of another of the contact pairs.

The invention comprises, in another form thereof, a communication plug with a plug body having a cavity, a circuit board located in the cavity and having a plurality of traces defining a plurality of conductor pairs, and a common mode choke connected between two of the traces defining one of the pairs.

The invention comprises, in another form thereof, a method of designing a communication plug, including the steps of: reducing inherent asymmetric crosstalk in the plug; and adding another asymmetric crosstalk in the plug to produce symmetric crosstalk in the plug.

The invention comprises, in another form thereof, a communication plug for making electrical contact between a communication cable and a communication jack, including a plug body having a cavity for receiving the communication cable, wherein the communication cable enters the plug body along an axis. A circuit board is located in the cavity and has a plurality of traces. Contacts are included for making electrical contact between traces on the circuit board and the jack, wherein the contacts each have a surface area parallel to the axis, the surface area being smaller than a predetermined value.

BRIEF DESCRIPTION OF THE DRAWINGS

The above-mentioned and other features and advantages, and the manner of attaining them, will become more apparent and the disclosure will be better understood by reference to the following description taken in conjunction with the accompanying drawings, wherein.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION

Figure 1A:
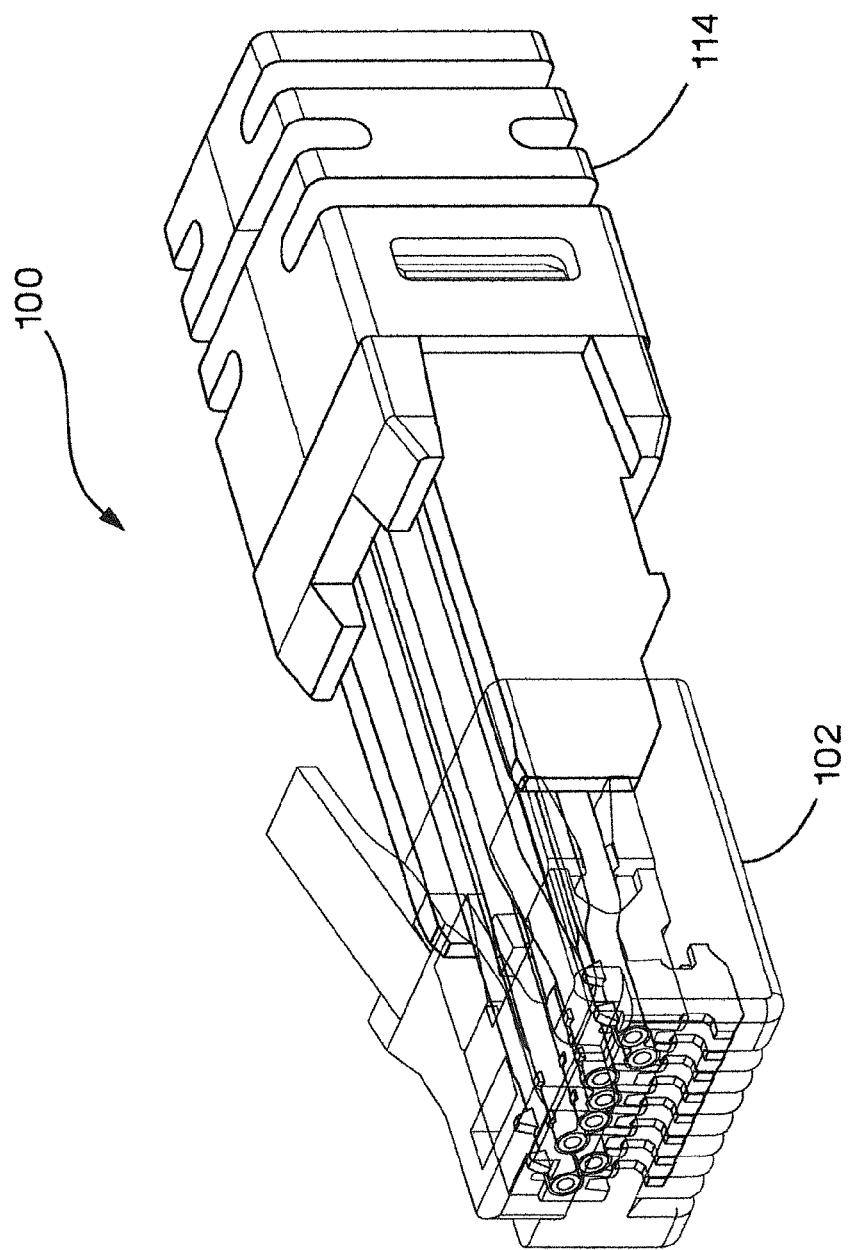
FIG. 1A is a perspective view of a typical communication plug, with the plug body shown translucent to illustrate internal wires and contacts.

Referring to the drawings, FIGS. 2A-7 relate to a first embodiment, while FIGS. 8A-15B related to a second embodiment. The illustrated embodiments are described using examples, and are not intended to limit the scope of the claimed invention in any way. For example, one or more combinations, or subcombinations, of the two illustrated embodiments might fall within the claimed invention and are intended to be included within the scope of protection. The claims appended hereto set forth the intended scope of the invention.

Figure 2A:
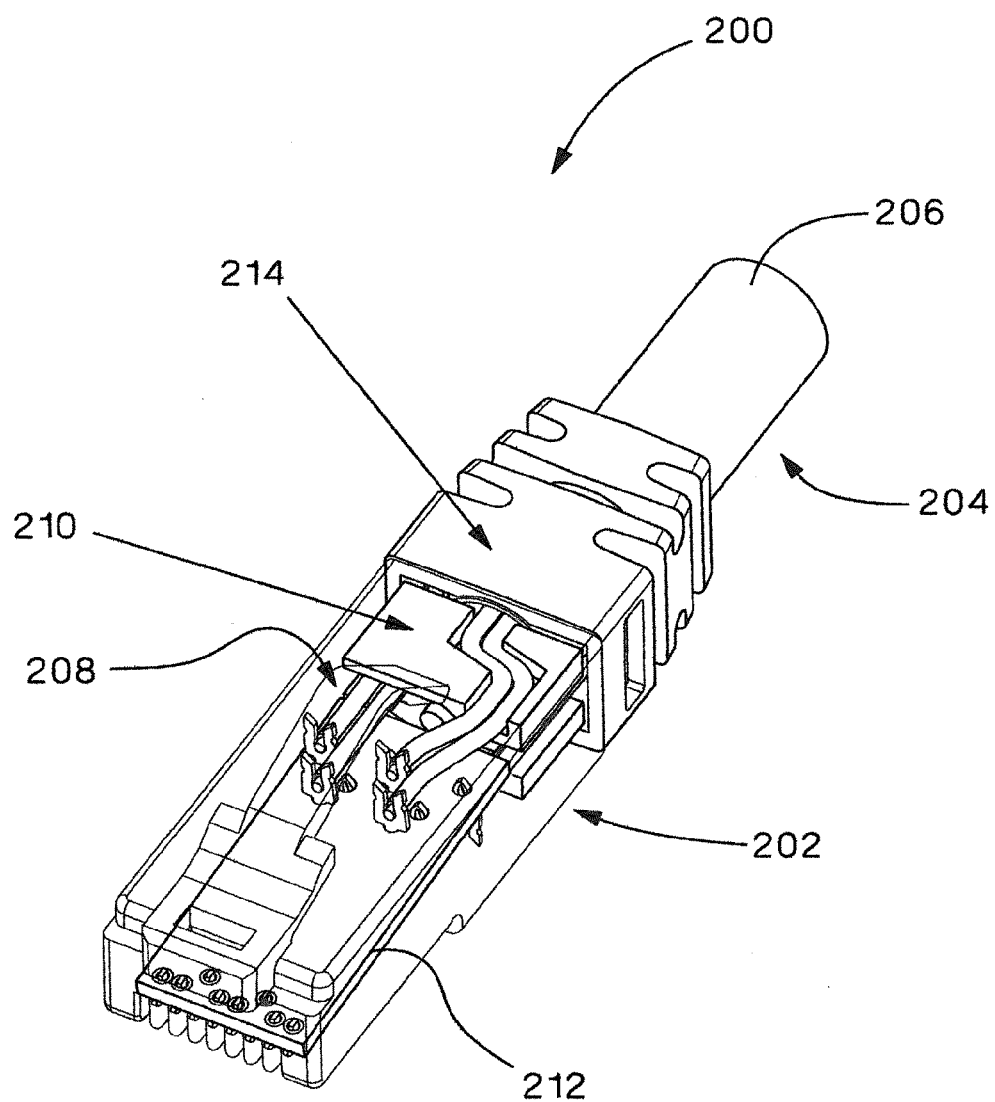
FIG. 2A is a perspective view of an embodiment of a communication plug according to the present invention, with the plug body shown translucent to illustrate internal components.
Figure 2B:
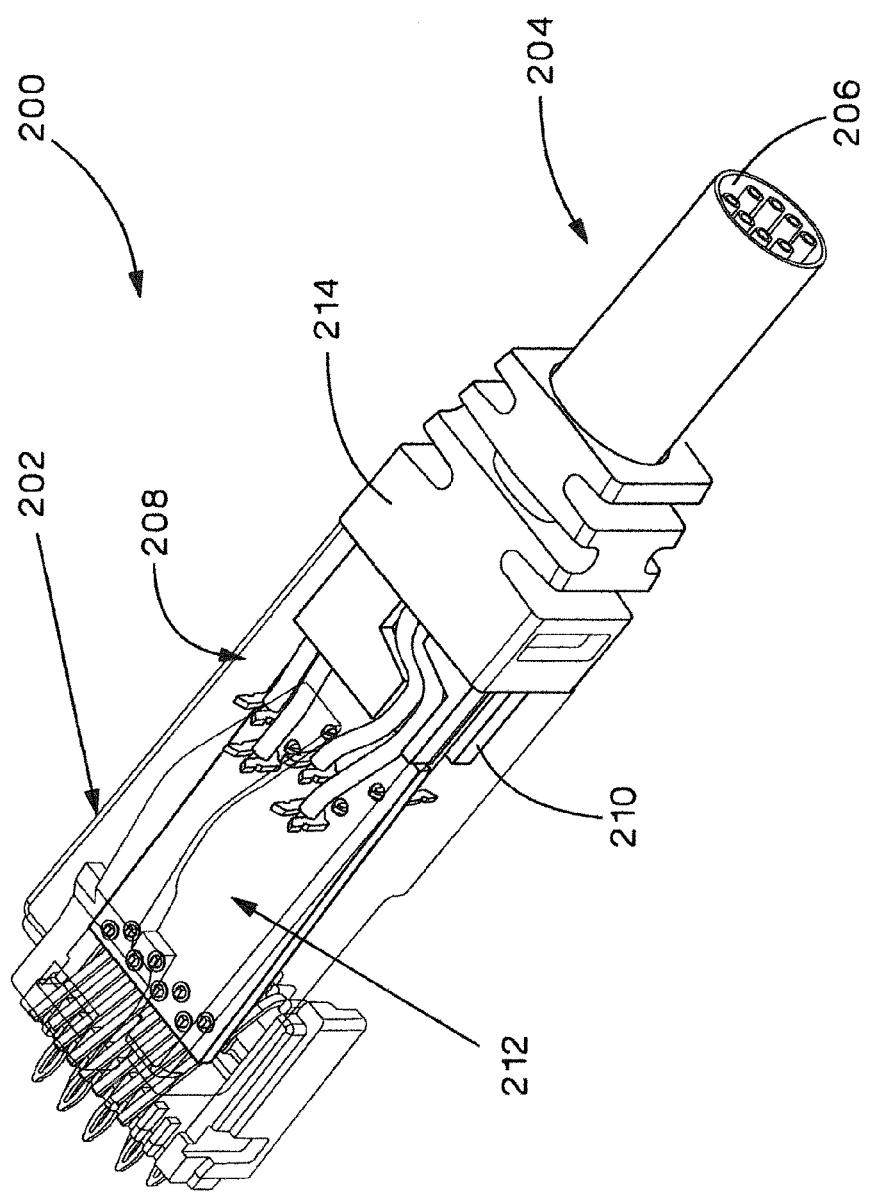
FIG. 2B is another perspective view of the communication plug of FIG. 2A, with the plug body shown translucent to illustrate internal components.

FIGS. 2A and 2B are isometric views of a communication plug 200, with the plug body 202 shown translucent to illustrate internal components. The plug 200 is connected through a strain relief boot 214 to a cable 204 comprising an outer insulating jacket 206 surrounding wire pairs 208 that terminate through a wire guide 210 in the plug body 202 at a circuit board 212. The wire pairs 208, wire guide 210, and circuit board 212 are illustrated in further detail in FIGS. 3A-7.

One function of the circuit board 212 is to provide a means of introducing coupling in the data path in order to provide an appropriate amount of crosstalk, as required by the TIA-568-B.2-10 standard. The circuit board 212 is preferably a printed circuit board (PCB) that includes embedded capacitors and/or inductors arranged in such a way to achieve a desired balance and crosstalk performance. The exact values and arrangement of these capacitors and/or inductors will depend on the electrical characteristics of the particular plug 200 and its intended application.

Figure 3A:
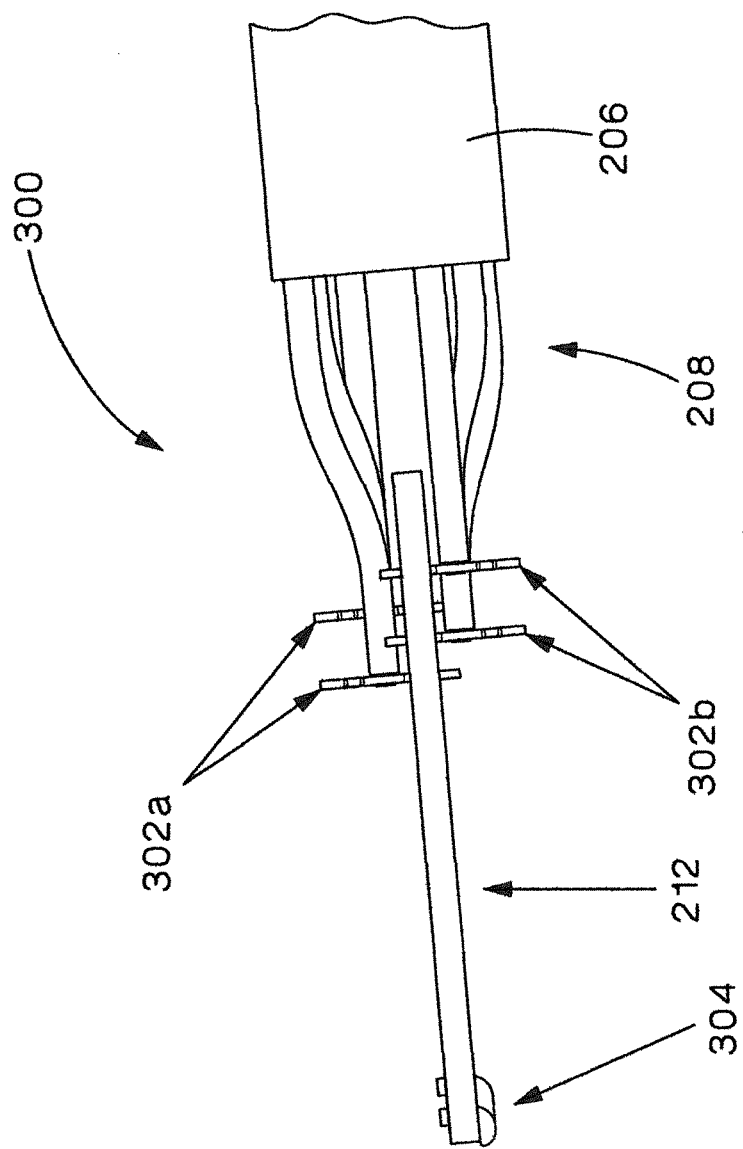
FIG. 3A is a side view of an assembly of wires engaged with a circuit board, in accordance with the configuration of FIGS. 2A and 2B.
Figure 3B:
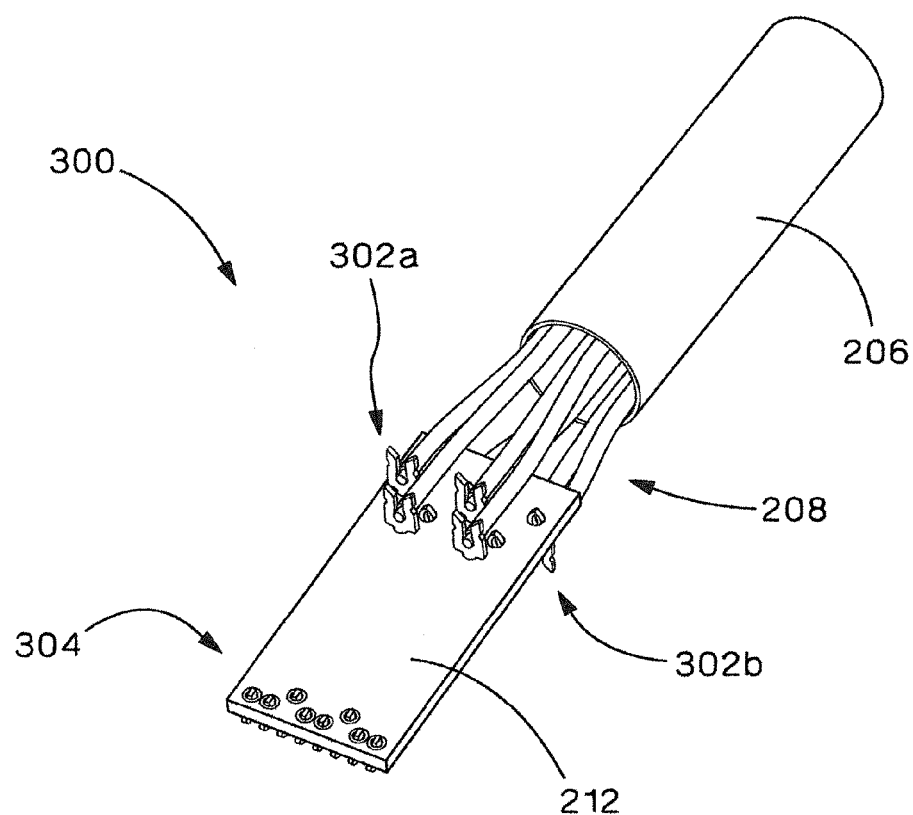
FIG. 3B is a perspective view of the assembly of FIG. 3A.

FIGS. 3A and 3B show an assembly 300 of wires engaged with a circuit board, in accordance with the configuration of FIGS. 2A and 2B. FIG. 3A is an elevation view, while FIG. 3B is an isometric view. The assembly 300 illustrates how the plug 200 would look if the plug body 202 and strain relief boot 214 were to be removed.

The assembly 300 includes the outer insulating jacket 206, wire pairs 208, and circuit board 212. The circuit board 212 includes contacts 304, for making electrical contact with plug interface contacts (PICs) in a corresponding jack (not shown). The circuit board 212 also includes insulation displacement contacts (IDCs) 302a-b for making electrical connections between traces (not shown) on the circuit board 212 and the differential wire pairs 208. The IDCs 302a-b are preferably press-fit into the circuit board 212 on both the top (302a) and bottom (302b) sides.

Figure 4A:
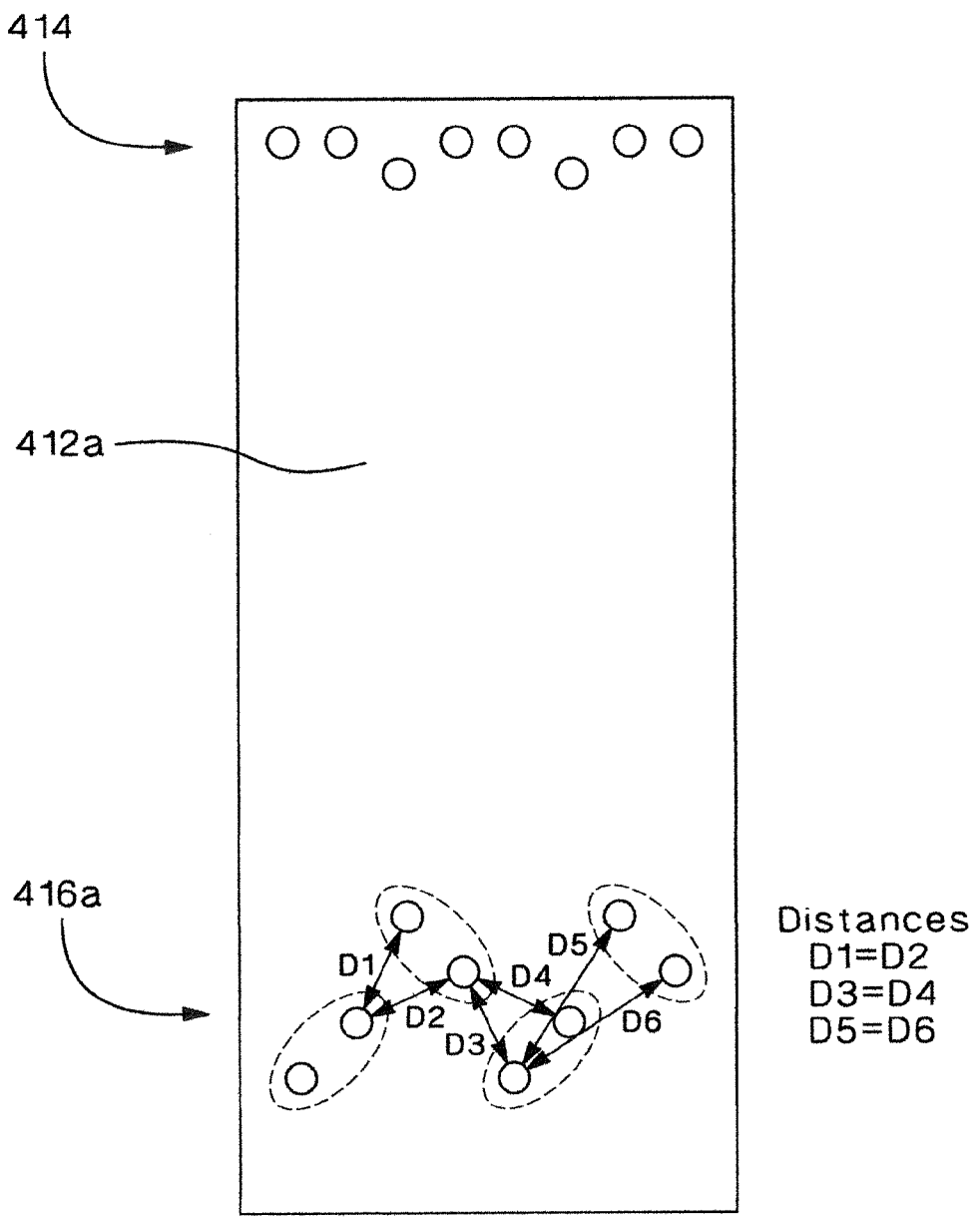
FIG. 4A is a schematic view of a semi-balanced IDC layout of one embodiment of a circuit board according to the present invention.
Figure 4B:
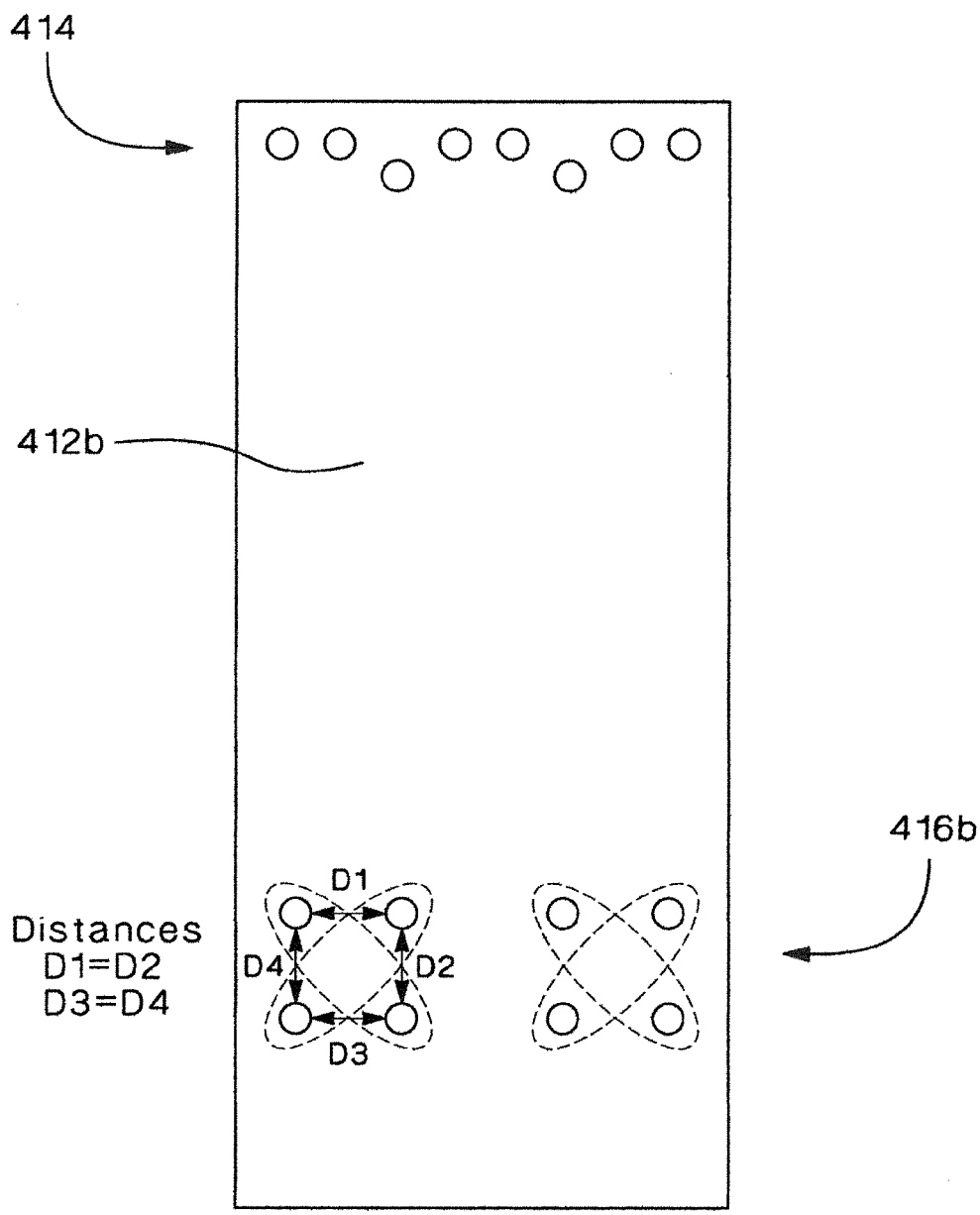
FIG. 4B is a schematic view of a balanced IDC layout of one embodiment of a circuit board according to the present invention.

FIGS. 4A and 4B are plan views of two alternative conceptual configurations (412a-b) for the IDCs of circuit board 212. Both configurations place the IDCs in a staggered orientation, with substantially equal distances between neighboring contacts to achieve balanced coupling between neighboring pairs. In the first embodiment (FIG. 4A), the IDC press-fit holes 416a in the circuit board 412a are configured in a diagonal orientation with respect to the length of the circuit board 416a. As such, the IDC press-fit hole for a particular wire pair that is nearest any other hole for a different wire pair is arranged to be equi-distant to both holes for that different wire pair, so that more balanced coupling is provided between adjacent IDC pairs. Therefore, in the circuit board 412a, distance D1 is equal to distance D2, distance D3 is equal to distance D4, and distance D5 is equal to distance D6. Similarly, in the second embodiment (FIG. 4B), in order to provide the same type of balanced coupling, the press-fit holes 416b are arranged diagonally in a square configuration, so that distance D1 equals distance D2 and distance D3 equals distance D4.

The contact press-fit holes 414, like the IDC press-fit holes 416a-b, are also positioned in a staggered configuration, in order to minimize crosstalk and corresponding imbalances between adjacent contacts. Further details regarding the contacts and their configuration will be provided with respect to FIG. 6.

Figure 5:
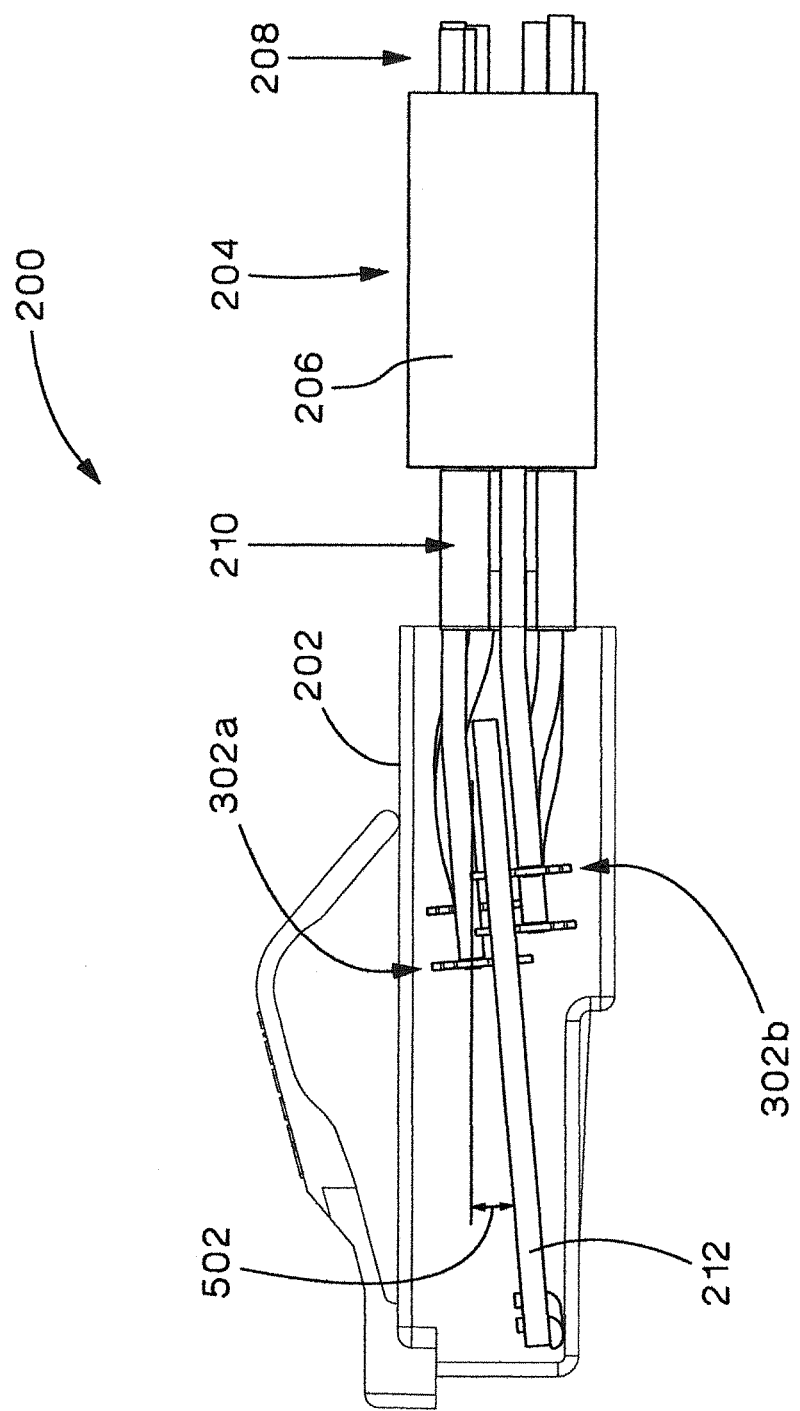
FIG. 5 is a side view of the communication plug of FIGS. 2A and 2B, with the plug body shown translucent to illustrate internal components.

FIG. 5 is an elevation view of a communication plug 200, with the plug body 202 shown translucent to illustrate internal components. The plug 200 includes the plug body 202, circuit board 212, IDCs 302a-b, and wire guide 210, and is connected to a cable 204 comprising wire pairs 208 surrounded by an outer insulative jacket 206. The wire guide 210 positions the wire pairs 208 for proper engagement with the IDCs 302a-b.

A feature of the present disclosure is the angled configuration of the circuit board 212 within the plug body 202. As seen from the side (FIG. 5), the circuit board 212 is angled at an angle 502 relative to the incoming cable 204. The angle 502 may also be defined relative to other objects in the plug 200, such as a horizontal plane formed by an upper and/or lower surface of the plug body 202, for example. According to preferred embodiments, the angle 502 can be in the range of greater than 0 degrees to 20 degrees, in the range of 1 degree to 10 degrees, in the range of 3 degree to 7 degrees, or can be approximately 5 degrees. Other angles are possible as well, and will depend on the available space within the plug body 202. In general, the angle 502 will be greater than 0 degrees, but less than an angle whose tangent is y/x, where y and x represent the interior height and length, respectively, of a generally rectangular interior cross-section of the plug body 202. The upper bounds of the angle 502 will be determined by several factors other than the interior geometry of the plug body 202 as well as including the thickness of the circuit board 212, the radius of the insulated wires in the wire pairs 208, and the geometries of the contacts 304 (see FIGS. 3A-3B) and IDCs 302a-b, according to a preferred embodiment.

Placing the circuit board 212 at an angle creates more room within the plug body 202, particularly the IDC end of the plug body, so that the IDCs 302a-b can be mounted on both the top and bottom of the circuit board 212 without interfering with the plug body 202 and without requiring the size of the plug body 202 to be increased. The angle 502 also allows the eight metal contacts (in the preferred embodiment) to be shorter than they would otherwise need to be if the circuit board 212 were horizontal. This, in turn, minimizes the inherent coupling between adjacent contacts and the associated imbalances resulting therefrom.

Figure 1B:
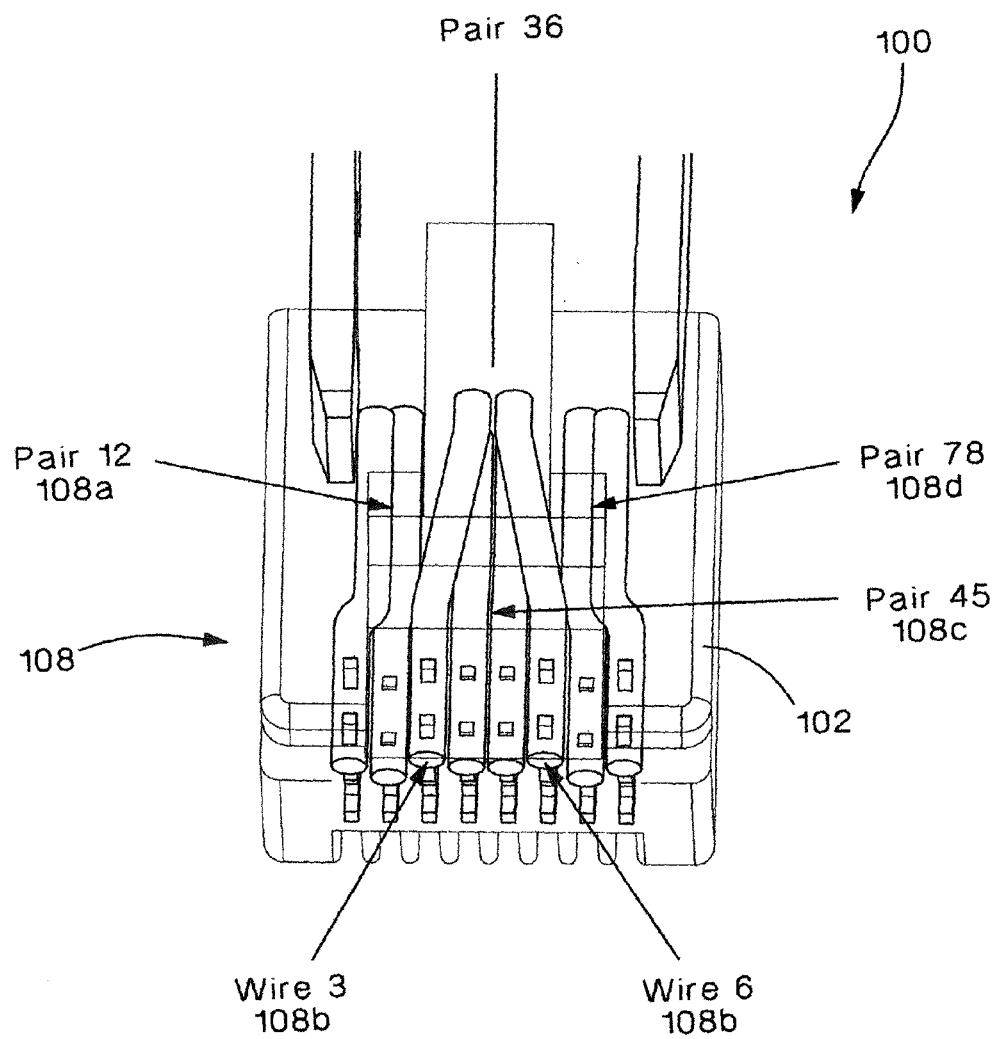
FIG. 1B is another perspective view of the typical communication plug of FIG. 1A, with the plug body shown translucent to illustrate internal wires and contacts.

Placing IDCs 302a-b on the top and bottom side of the circuit board 212 minimizes crosstalk between differential pairs by separating adjacent wire pairs onto opposite sides of the circuit board 212. Another benefit over the typical design shown in FIGS. 1A-1B is that wire pair 3-6 no longer needs to be split around wire pair 4-5. The required split of pair 3-6 can instead be achieved in a more controlled manner using traces on the circuit board 212. This can result in a much smaller "super-pair" signal being generated in the plug 200, and avoids a major source of crosstalk complexity in the wire termination/IDC 302a-b region.

Figure 6:
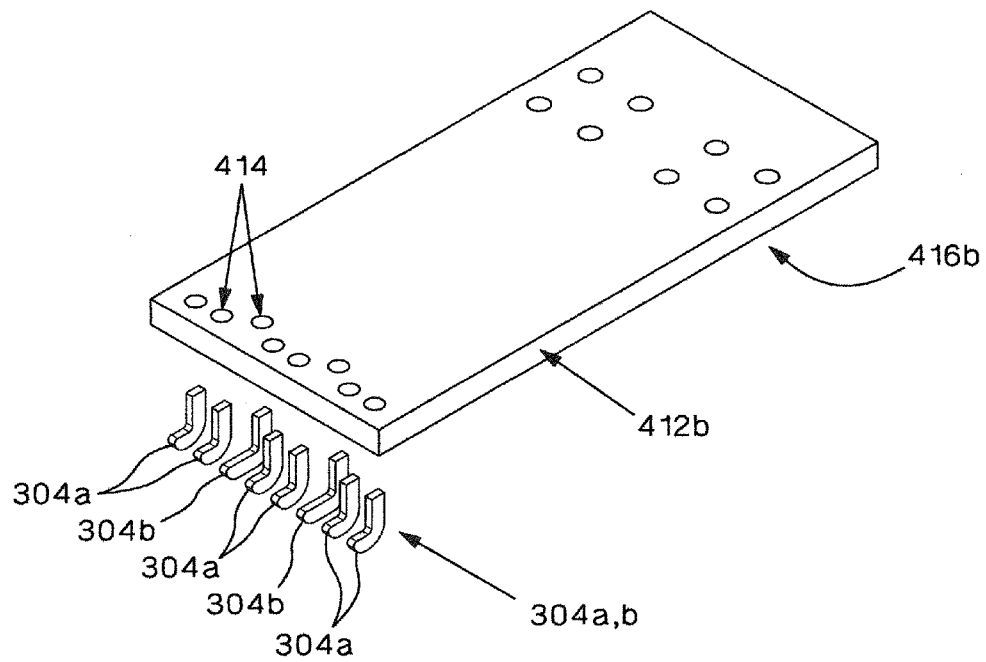
FIG. 6 is an exploded perspective view of an embodiment of a circuit board of the plug of FIGS. 2A and 2B, showing how the plug contacts are inserted, according to one embodiment of the present invention.

FIG. 6 is an isometric view of the circuit board 412b showing where contacts 304a-b are inserted, according to one embodiment. The circuit board 412b could, for example, serve as the circuit board 212 shown in FIGS. 2A-B, 3A-B, and 5. The IDC hole pattern 416b matches that shown in FIG. 4B.

The circuit board 412b includes eight staggered holes 414 for accommodating eight metal contacts 304a-b. These contacts 304a-b can be press fit or soldered to the circuit board 412b, for example. The staggered configuration minimizes crosstalk and the corresponding imbalances between adjacent contacts 304a-b.

Figure 7:
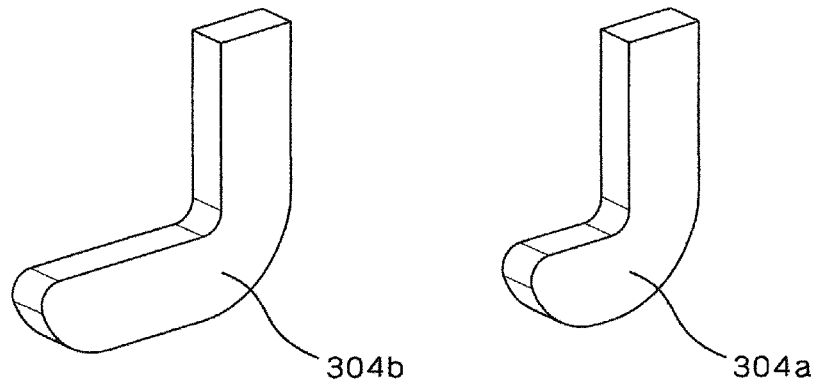
FIG. 7 is a perspective view of a first contact type and a second contact type used as shown in FIG. 6, according to one embodiment of the present invention.

To ensure compliant contact locations to mate with any industry standard RJ45 jack, two different shapes/sizes are provided for the staggered contacts 304a-b, as shown in FIG. 7. A shorter contact 304a is used for the holes 414 that are closer to the edge of the jack end of the circuit board 416b, while a longer contact 304b is used for holes 414 that are further from the edge. As illustrated, the pair 3-6 is shown with longer contacts 304b, while the other pairs are shown with shorter contacts 304a. The location and radius of the contacts 304a-b are designed to be compliant with industry standard IEC 60603-7, specifying a contact radius of 0.020 inch.

Figure 8A:
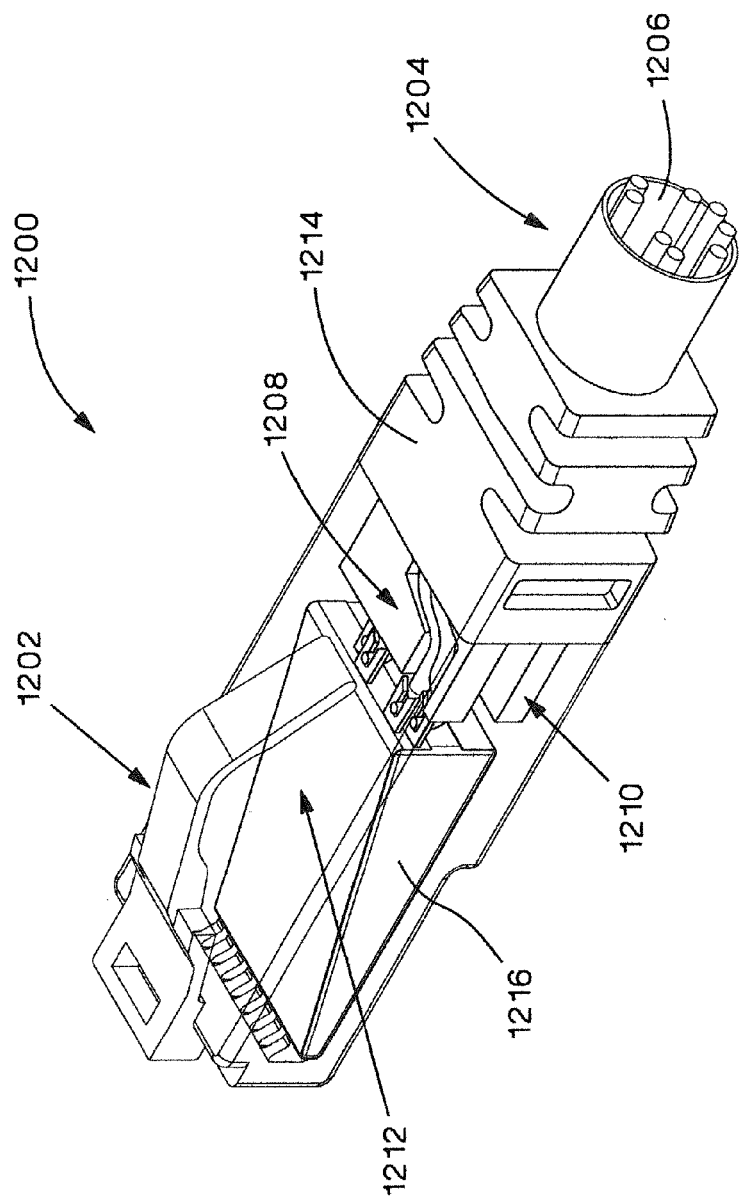
FIG. 8A is a perspective view of another communication plug, with the plug body shown translucent to illustrate internal components, according to one embodiment of the present invention.
Figure 8B:
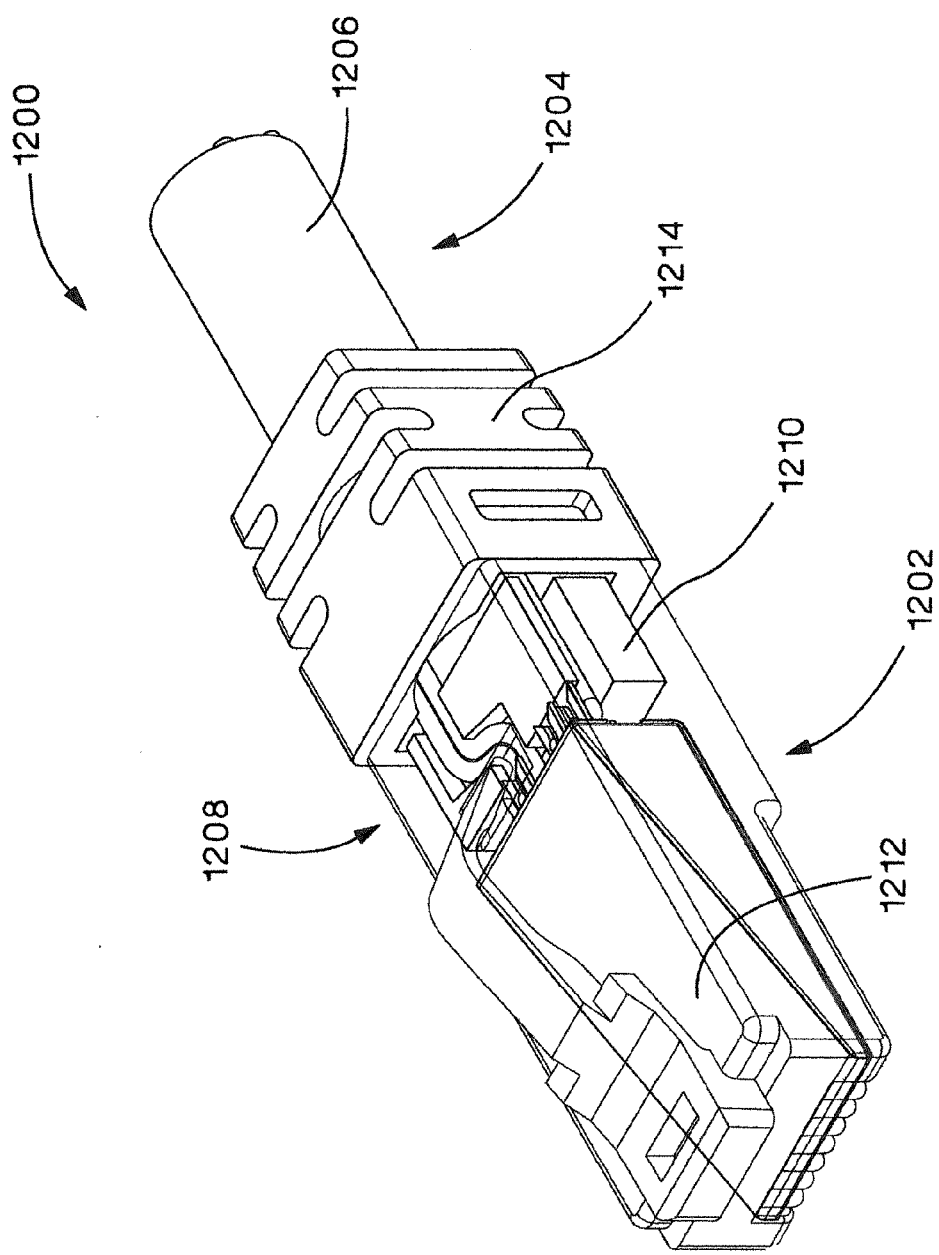
FIG. 8B is a perspective view of another side of the communication plug of FIG. 8A, with the plug body shown translucent to illustrate internal components.

FIGS. 8A and 8B are isometric views of an alternative communication plug 1200, with the plug body 1202 shown translucent to illustrate internal components. The plug 1200 includes the plug body 1202 connected through a strain relief boot 1214 to a cable 1204 comprising an outer insulating jacket 1206 located over a plurality of wire pairs 1208.

A wire guide 1210 positions wires from the wire pairs 1208 so that they may make electrical contact (via IDCs, which are not shown in FIGS. 8A and 8B) with a circuit board 1212 on a body 1210. The body 1210 is preferably a molded plastic body upon which the circuit board 1212 is located. The circuit board 1212 is preferably a flexible printed circuit board attached to the body 1210. While other implementations may be possible, the example illustrated in FIGS. 8A-12 is described with respect to a flexible printed circuit board attached to a molded plastic body.

The circuit board 1212 is designed to introduce coupling in the data path (from the wire pairs 1208 to the contacts 1600, see FIG. 12) to provide an appropriate amount of crosstalk as required by the TIA-568-B.2-10 standard. The circuit board 1212 may include electrical features such as embedded capacitors and inductors arranged to achieve a desired balance and crosstalk performance. The exact values and arrangements of electrical features will depend on the desired application and its accompanying electrical and/or mechanical constraints.

Figure 9A:
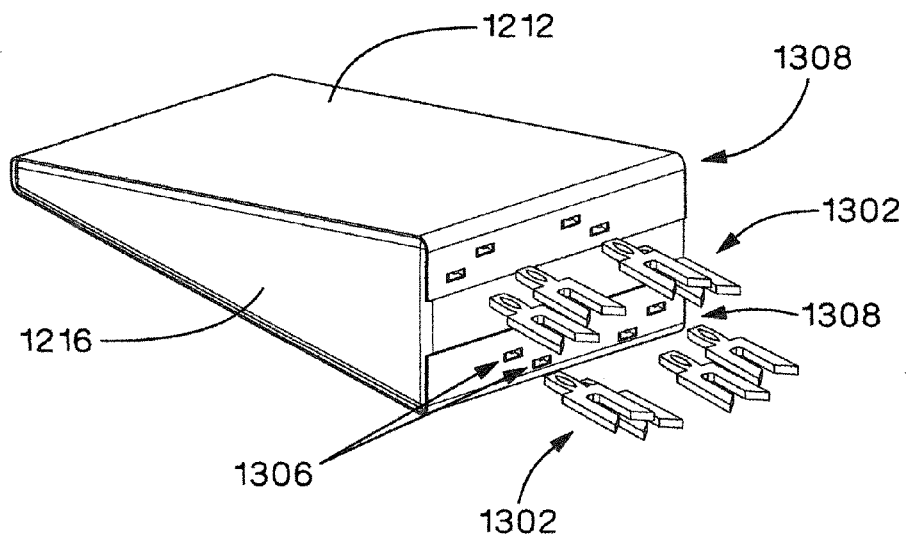
FIG. 9A is a perspective view of an assembly comprising a circuit board, body, and IDCs for use in the communication plug of FIGS. 8A and 8B.
Figure 9B:
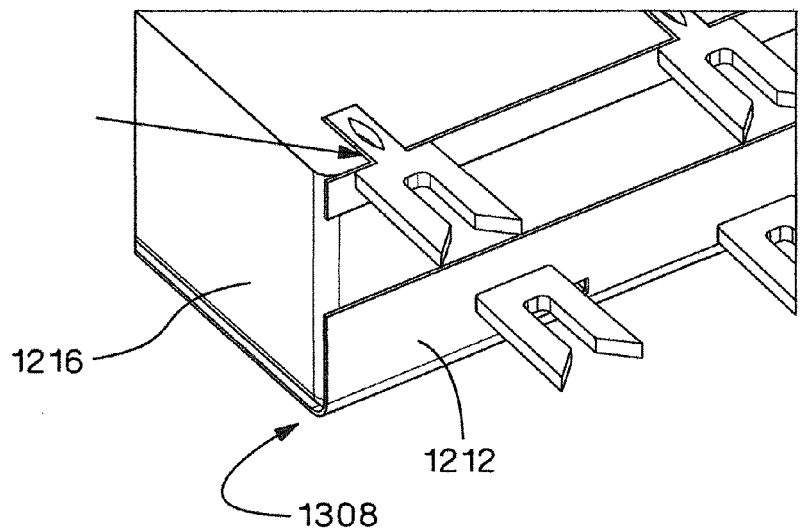
FIG. 9B is a close-up perspective cutaway view of the assembly of FIG. 9A, illustrating construction details.

FIGS. 9A and 9B are perspective views of an assembly comprising a flexible circuit board 1212, body 1216, and IDCs 1302 for use in the alternative communication plug of FIGS. 8A and 8B. The IDCs 1302 are preferably press fit into appropriately-sized holes or pockets 1306 in the back end of the body 1216. Each differential pair from the cable 1204 makes contact with the circuit board 1212 through one of the IDCs 1302.

The circuit board 1212 (a flexible printed circuit board, in the illustrated example) preferably includes a tin-plated contact pad that is folded over the rear edges of the body 1216 as shown in FIGS. 9A and 9B. Holes may be placed in the circuit board 1212 to correspond to the holes or pockets 1306 in the body 1216. Then, when the IDCs 1302 are press fit into the holes or pockets 1306, the inherent force creates a gas-tight connection between the IDCs 1302 and the circuit board 1212, creating corresponding electrical connections. This configuration also helps to secure the circuit board 1212 to the body 1216.

Figure 10A:
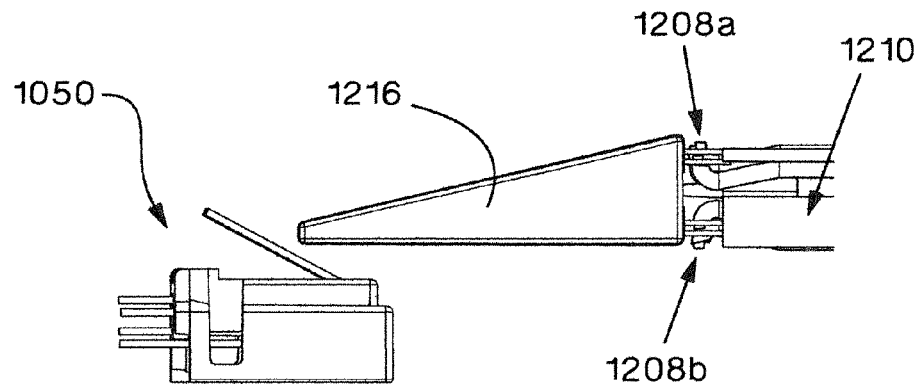
FIG. 10A is a fragmentary side view of an assembly comprising a circuit board, body, IDC's, wires, and wire guide interfacing with a jack contact assembly.

As shown in FIGS. 9A, 9B, and 10A in the illustrated example, the IDCs 1302 are located at both ends of the circuit board 1212, toward the top and bottom edges 1308 of the body 1216. This allows the individual wires in the wire pairs 1208a-b (not shown in FIGS. 9A and 9B) to be relatively separated when they make contact with the circuit board 1212 through the IDCs 1302. This separation of adjacent wires reduces crosstalk between differential pairs 1208a-b.

Figure 10B:
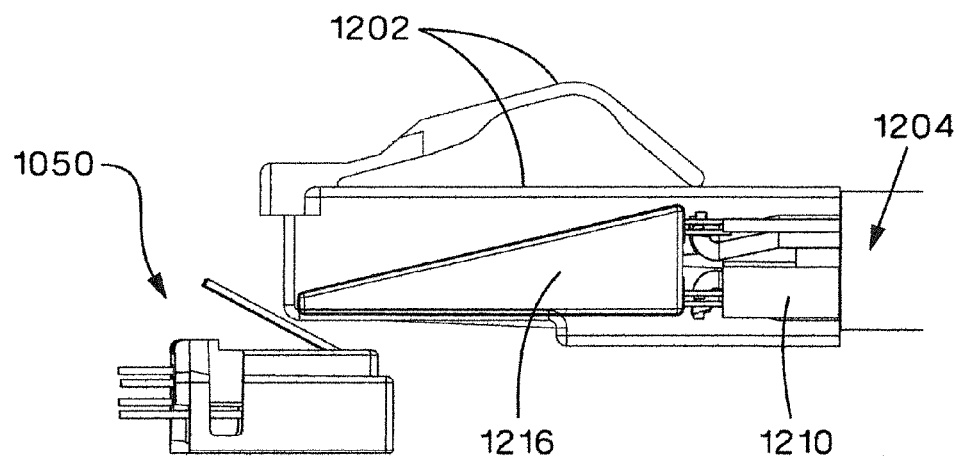
FIG. 10B is an additional side view showing the assembly of FIG. 10A inside a plug body.

Also illustrated in FIG. 10A and/or in FIG. 10B is a plug body 1202, cable 1204, wire guide 1210, and a jack contact assembly 1050 from a typical RJ45 communication jack. The wire guide 1210 is used to position the wires in the wire pairs 1208a-b for proper and repeatable engagement with the IDCs 1302. For example, the wire guide 1210 could include a plurality of slots and/or retention members configured to hold individual wires in positions corresponding to the location of the IDCs 1302.

Figure 11A:
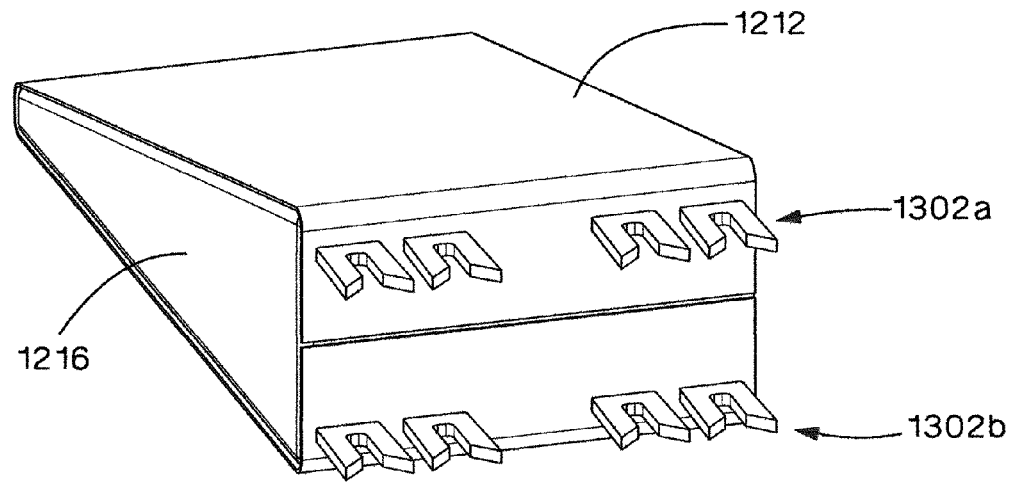
FIG. 11A is a perspective view of the assembly of FIG. 9A, showing the IDC's installed.
Figure 11B:
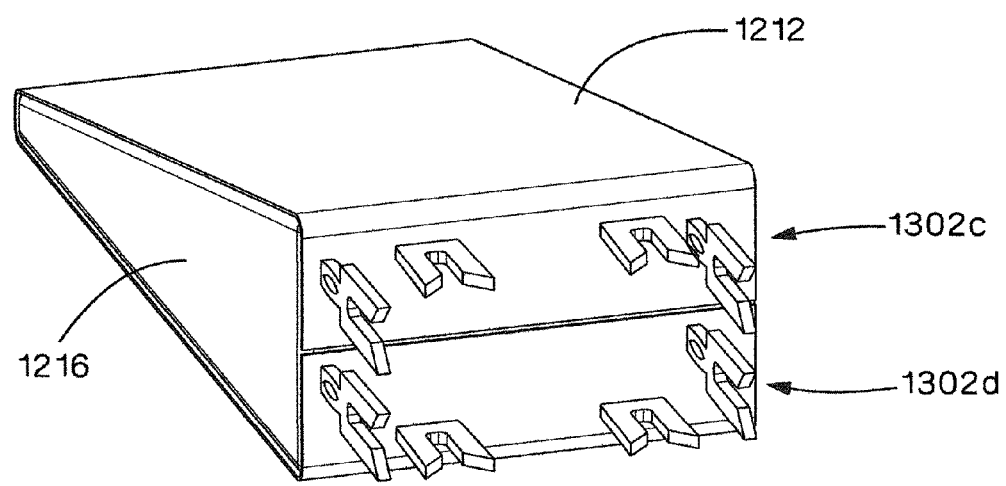
FIG. 11B is a perspective view of an assembly similar to the one shown in FIG. 11A, showing the IDC's installed in an alternative configuration.

FIGS. 11A and 11B are perspective views of the assembly of FIG. 9A, showing the IDCs 1302 installed in two alternative configurations. In FIG. 11A, the upper IDCs 1302a and lower IDCs 1302b are installed in respective linear rows aligned at each end of the circuit board 1212 on the body 1216. In FIG. 11B, the upper IDCs 1302c are installed at one end of the circuit board 1212 in a location corresponding to the rear-facing upper corners of the body 1216. The lower IDCs 1302d are installed at the other end of the circuit board 1212 in a location corresponding to the rear-facing lower corners of the body 1216.

The design shown in FIGS. 8A through 11B does not require that wire pair 3-6 be split around wire pair 4-5, as is the case in the typical plug shown in FIGS. 1A and 1B. The split can instead be implemented on the circuit board 1212 in a more controlled manner, which can result in a smaller "super-pair" signal being generated in the plug. This avoids a major source of crosstalk complexity in the wire termination/IDC 1302 region.

Figure 12:
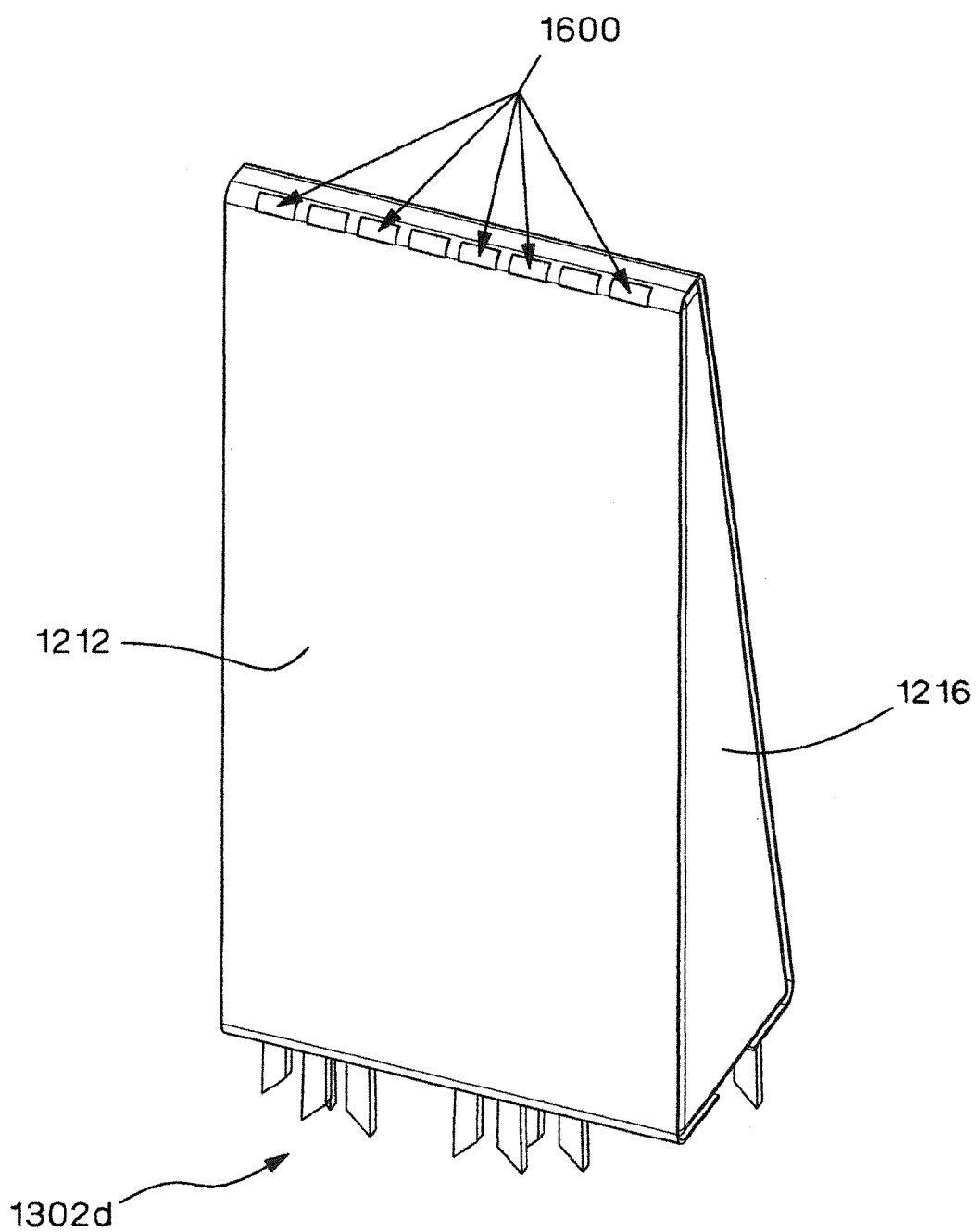
FIG. 12 is a perspective view of the underside of an assembly similar to the one shown in FIG. 11B, illustrating contact pads.

FIG. 12 is a perspective view of the underside of an assembly similar to the one shown in FIG. 11B, illustrating contact pads 1600 for making electrical contact with an industry standard RJ45 jack. The contacts 1600 are preferably eight metal contact pads located on the circuit board 1212 at the end of the body 1216 opposite the IDCs 1302. In the illustrated example, the IDCs 1302 are located at either end of the circuit board 1212, while the contact pads are located at or around the middle of the length of the circuit board 1212. The contact pads 1600 preferably are configured to present an edge radius that complies with industry standard IEC 60603-7 (0.020 inch).

The contact pads 1600 can be created by exposing copper on the circuit board 1212 and plating the copper with nickel and gold after the circuit board 1212 has been wrapped around (in the case of a flexible circuit board) and attached to the body 1216. The shape of the body 1216 helps to ensure that the contacts will have the compliant industry standard dimensions. Since the eight contact pads 1600 are preferably created from traces on the circuit board 1212, they are inherently thin (heightwise), provide relatively small amount of capacitive and inductive coupling between pair conductors, and consequently introduce very little coupling between neighboring contact pads 1600. This can improve balance performance for the plug.

FIGS. 13-15B illustrate an additional feature that may be included in the above described embodiments. In order to help attenuate any common mode signal that may propagate on a particular wire pair in the plug, a choke, such as a surface mount choke, may be included on the circuit board. Preferably, one choke is included for each of the wire pairs. By incorporating common mode chokes into the plug design, some Category 6A channels may be able to tolerate considerably higher levels of electromagnetic interference. The common mode chokes will attenuate the common mode signals caused by an interfering source, resulting in a lower noise level in the channel.

Figure 13:
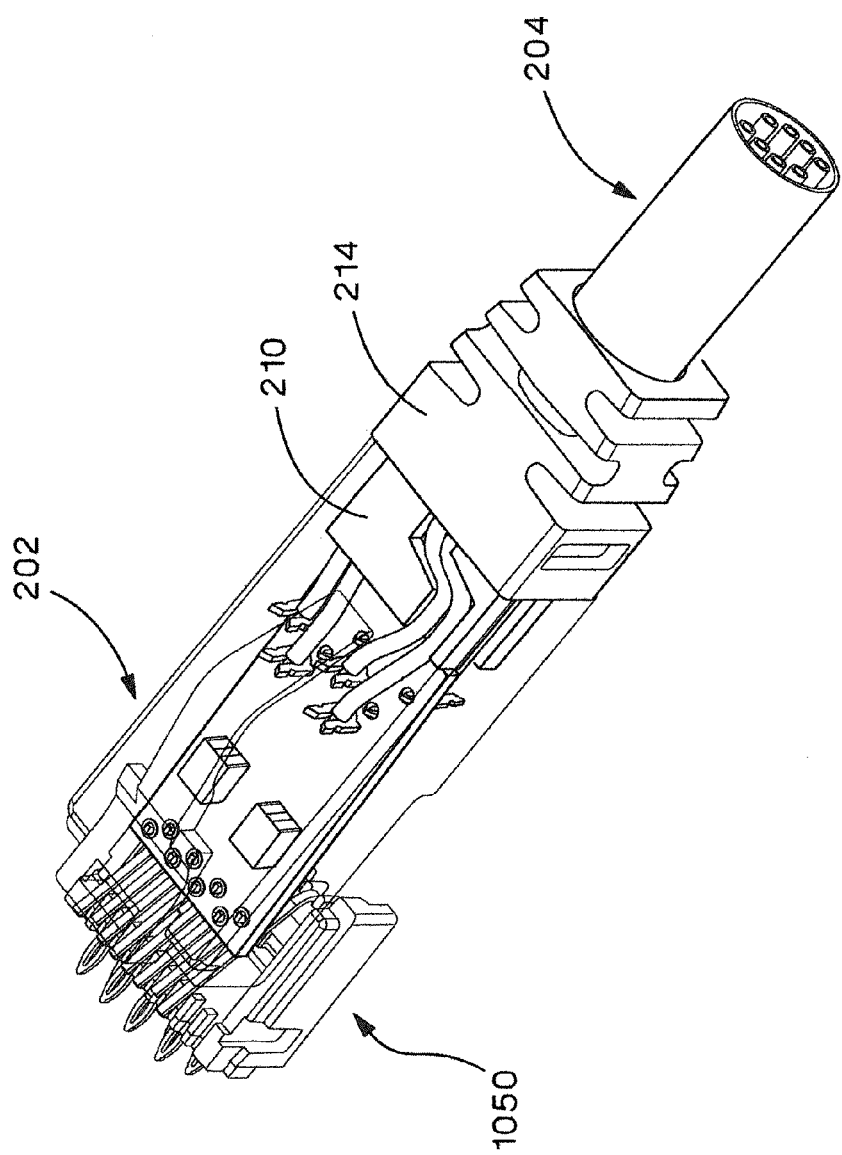
FIG. 13 is a perspective view of a communication plug with common mode chokes, with the plug body shown translucent to illustrate internal components.
Figure 14:
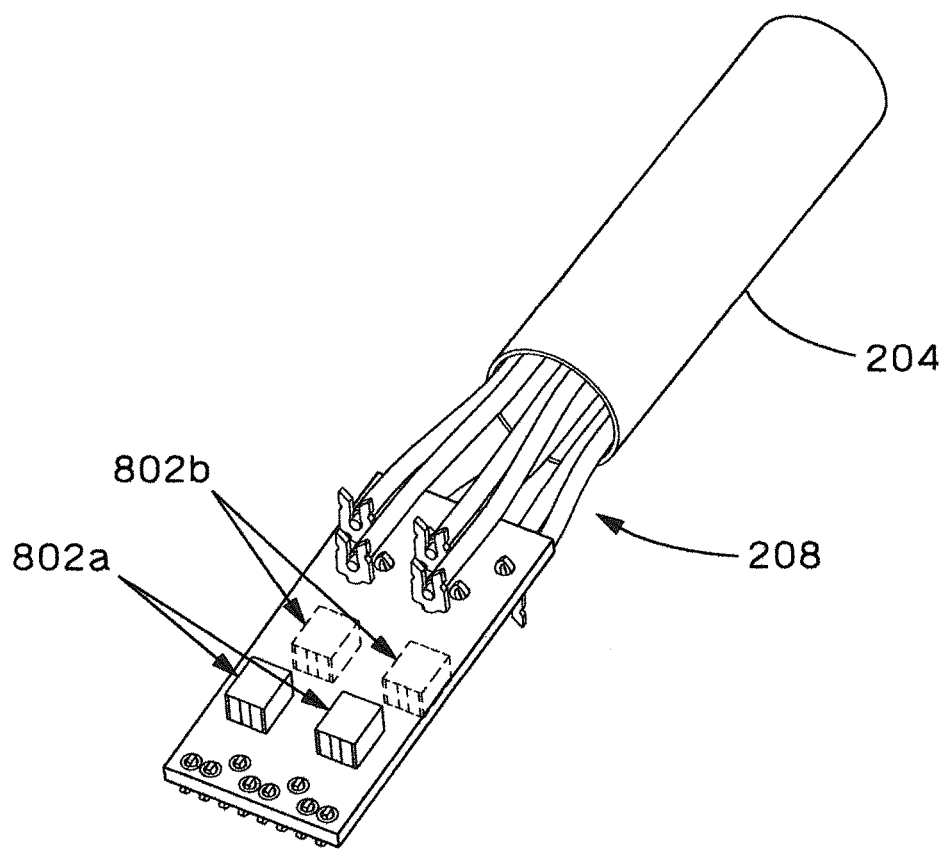
FIG. 14 is a perspective view of an assembly of wires engaged with a circuit board of FIG. 13.

FIGS. 13 and 14 illustrate the choke feature as implemented in the embodiments of FIGS. 2A-7. FIG. 13 shows the plug (having a plug body 202, wire guide 210, and strain relief boot 214 connected to a cable 204) interfacing with a jack contact assembly 1050, while FIG. 14 shows some of the internal components (e.g. circuit board 212) of the plug, connected to a cable 204 having wire pairs 208. The circuit board 212 has two common mode chokes 1802a on a top side and two common mode chokes 1802b on a bottom side. Thus, there are four total chokes to attenuate common mode signals on each of the four wire pairs 208.

Figure 15A:
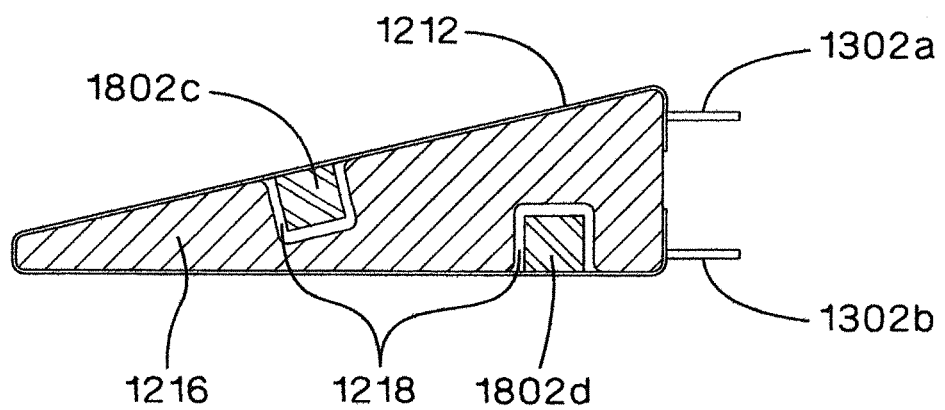
FIG. 15A is a cross-sectional side view of a portion of a plug having chokes.
Figure 15B:
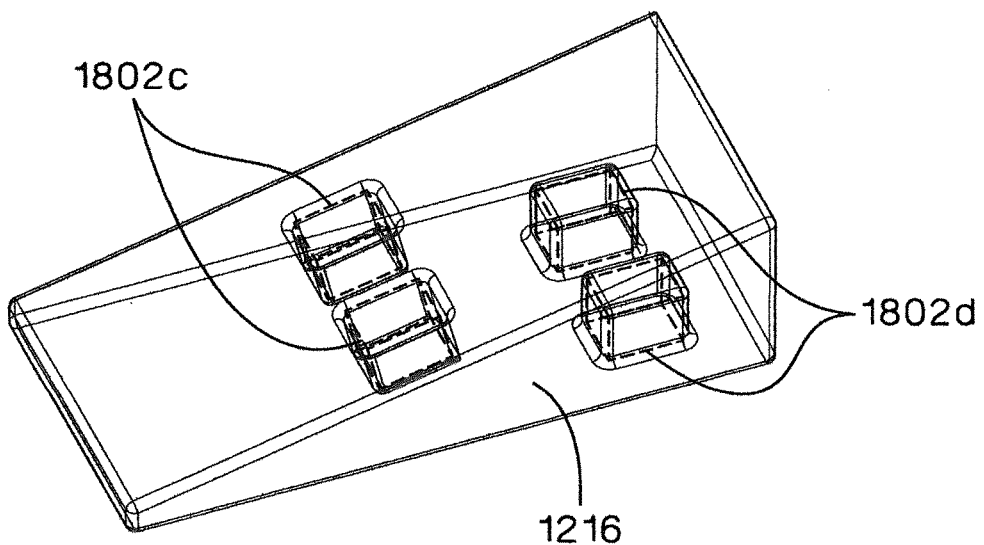
FIG. 15B is a perspective view of a portion of a plug having chokes.

FIGS. 15A and 15B illustrate the choke feature as implemented in the embodiments of FIGS. 8A-12, where the circuit board 1212 is a flexible printed circuit board wrapped around the molded body 1216 between two sets of IDCs 1302a-b. The common mode chokes 1802c-d are attached to the bottom side of the circuit board 1212. When the circuit board 1212 is wrapped around the body 1216, the chokes 1802c-d will be positioned within pockets 1218 in the body 1216. This allows the size of the body 1216 to be large, while still maintaining the overall plug dimensions.

Figure 16:
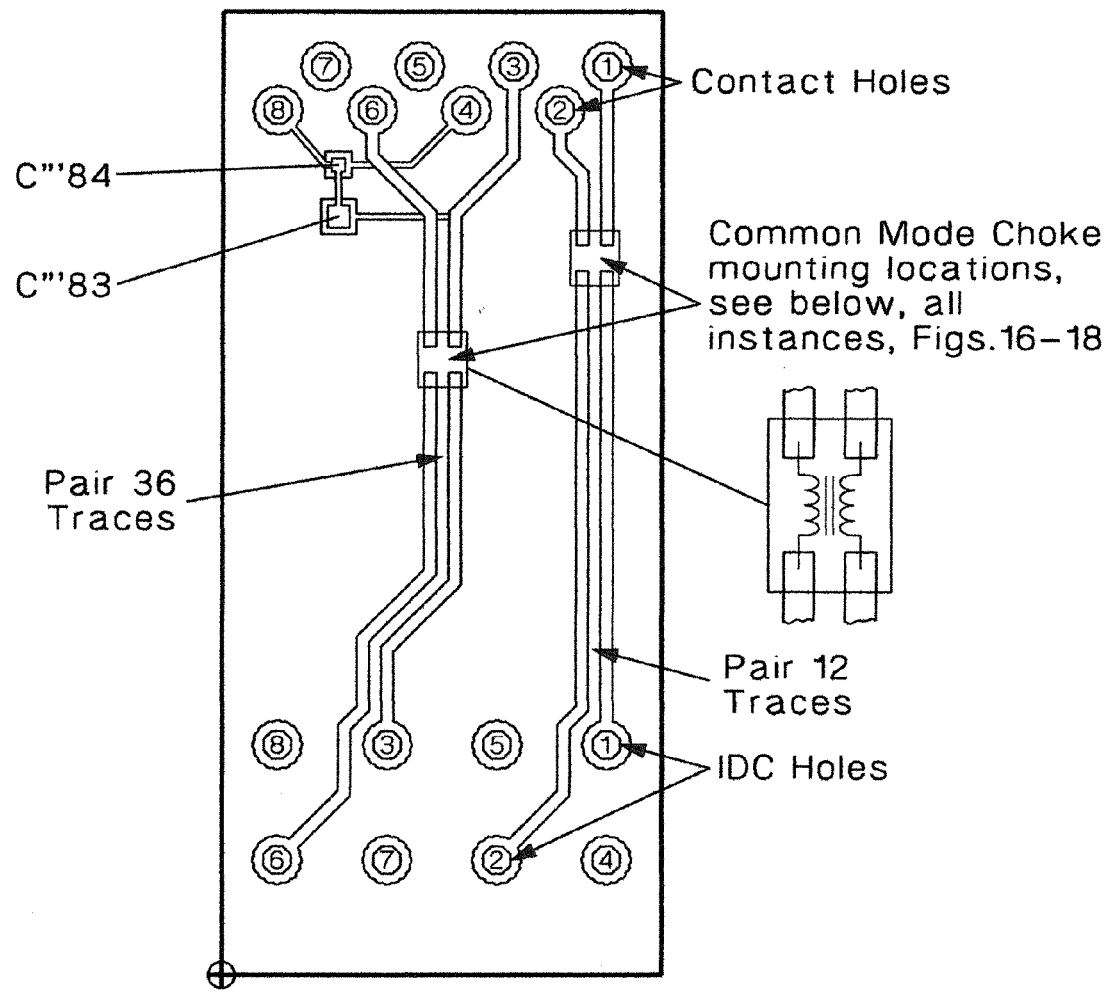
FIG. 16 is a PCB layout of two layers of the PCB used in the plug of FIGS. 2A and 2B.
Figure 17:
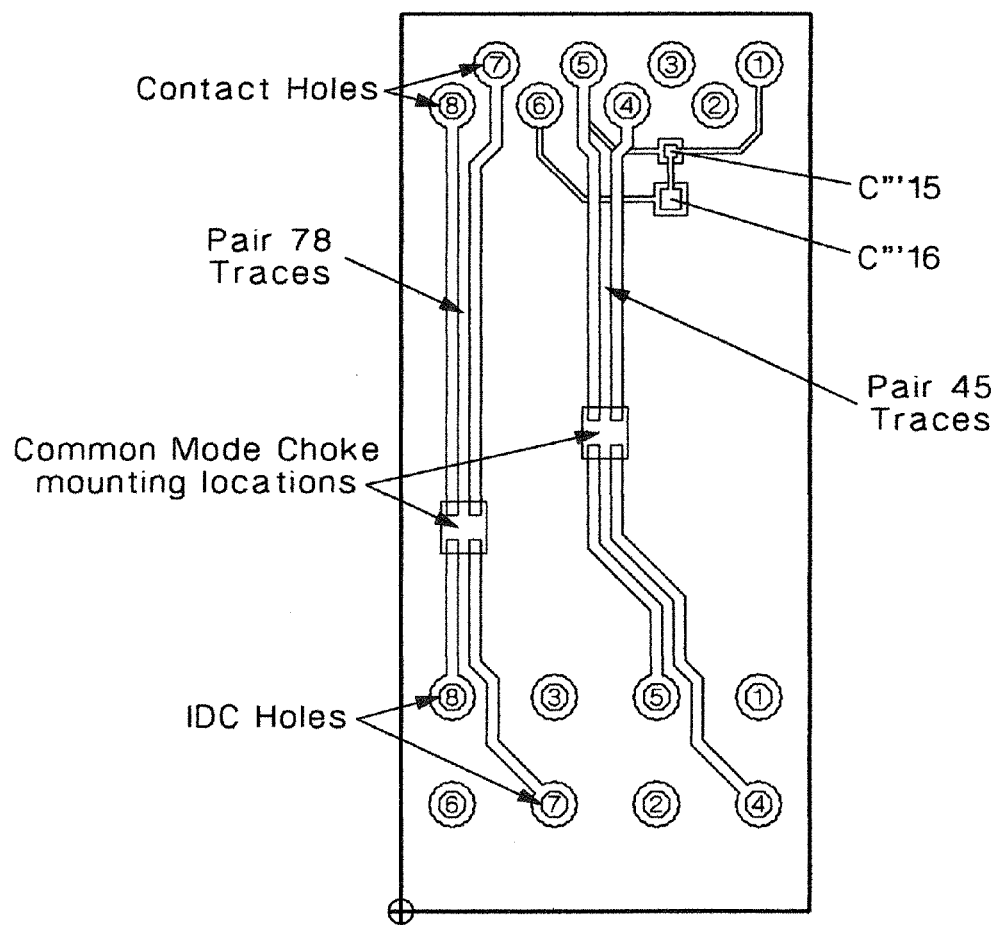
FIG. 17 is a PCB layout of the other two layers of the PCB used in the plug of FIGS. 2A and 2B.
Figure 18:
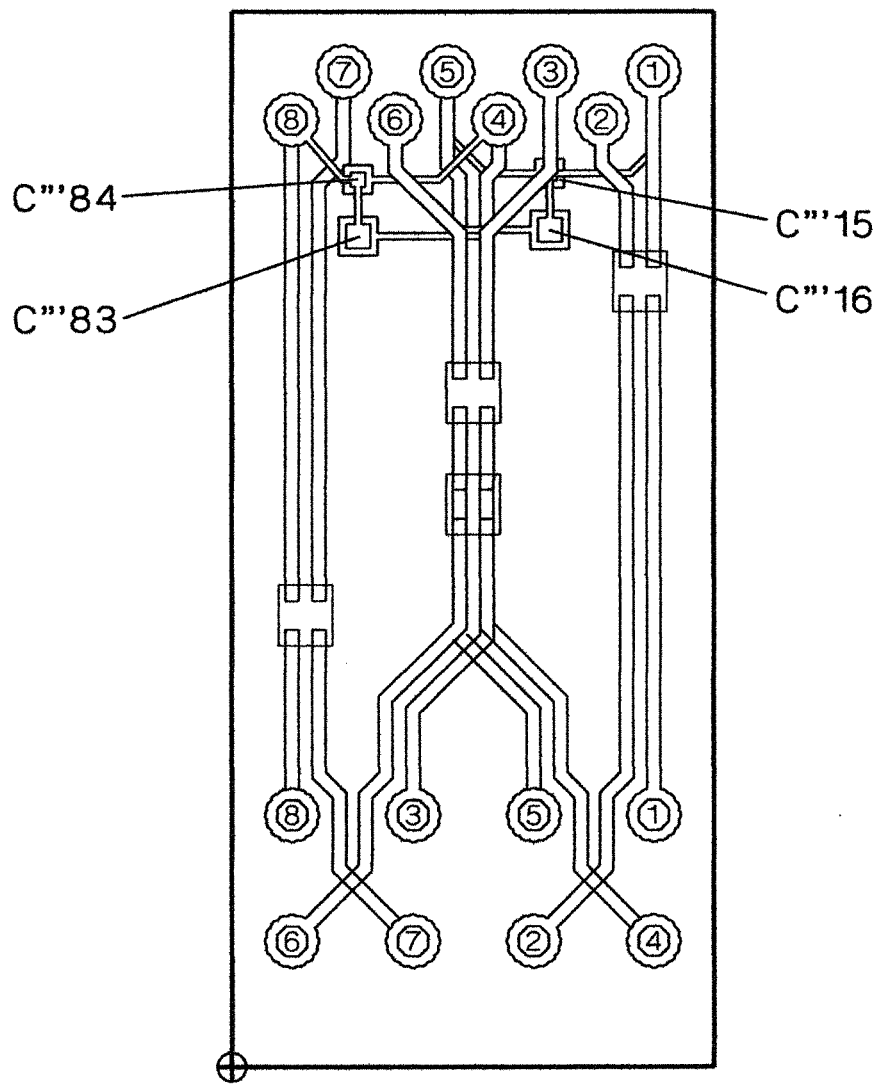
FIG. 18 is a PCB layout of all four layers from FIGS. 16 and 17.

FIG. 16 is a layout of two layers of the PCB used in the plug of FIGS. 2A and 2B; FIG. 17 is a layout of the other two layers of the PCB used in the plug of FIGS. 2A and 2B; and FIG. 17 is a PCB layout of all four layers from FIGS. 16 and 17. FIGS. 16-18 illustrate an embodiment for the locations of the added crosstalk elements (C'''15, C'''16, C'''83, and C'''84), and the common mode chokes. The crosstalk elements are pad capacitors with one side of the capacitor on one layer of the PCB, and the other side of the capacitor on another layer of the PCB. The common mode chokes designed for differential signaling applications and include a single ferrite core with each of the two differential coils/conductors wrapped around the core, with the coils being in series with a respective PCB trace. When a differential signal propagates through the choke, there is an equal and opposite current flow through the differential conductors. This produces a cancelling of magnetic flux within the ferrite core resulting in a low impedance path for the differential signal. When a common mode signal propagates through the choke, the current flow through the conductors is equal and in the same direction of propagation. This produces a cumulative magnetic flux within the ferrite core resulting in increased impedance seen by common mode signals.

Given the arrangement of the eight plug contacts and conductors in the prior art plug of FIGS. 1A and 1B, there is an inherent amount of imbalance in the coupling between differential pairs. In the IPC contact region, the conductor 2 IPC of differential pair 1-2 is much closer in proximity to the conductor 3 IPC of differential pair 3-6 than the conductor 1 IPC of differential pair 1-2. (which is evident in FIGS. 1A and 1B) This results in an asymmetric crosstalk relationship between pair 1-2 and pair 3-6 leading to mode conversion due to the unequal capacitive loads on conductor 1 and conductor 2 of differential pair 1-2. The capacitive crosstalk between pair 1-2 and pair 3-6 is dominated by this coupling in the IPC contact region.

By reducing the surface area of the plug contacts as shown in FIGS. 6 and 7 relative to the plug contacts of FIGS. 1A and 1B, the capacitive coupling between contacts is reduced and thereby the inherent asymmetric crosstalk between pair 1-2 and pair 3-6 is reduced. The overall crosstalk between pairs in turn is also reduced due to the reduction in surface area. To remain in compliance with the plug's differential crosstalk requirements in ANSI/TIA-568-C.2, additional crosstalk is added to the printed circuit board (PCB) in the form of embedded capacitors as shown in FIGS. 16-18. A capacitor introduced between conductor 1 of pair 1-2 and conductor 6 of pair 3-6 results in an asymmetric crosstalk relationship between pairs 1-2 and pairs 3-6 on the PCB. This asymmetry in the PCB is mirrored with respect to the asymmetry in the contact region. The mode conversion that is introduced by the imbalance in capacitive coupling in the contact region is offset by the mode conversion that is introduced by the imbalance in capacitive coupling on the PCB. The net capacitive crosstalk between pairs 1-2 and pairs 3-6 in the plug is now balanced and the overall mode conversion is minimized due to the equal capacitive load on conductor 1 and conductor 2 of pair 1-2.

The crosstalk in the prior art plug of FIGS. 1A and 1B is a function of the distributed electrical parameters of the plug contacts and cable wires connected thereto, including particularly the distributed inductance and capacitance of the these components and the corresponding capacitive and inductive coupling associated therewith. However, the dominant mode of coupling is primarily capacitive due to the plug contacts, which can be thought of approximately as plate capacitors having capacitance proportional to area of the plates (contacts) and inversely proportional to distance between the capacitor plates (contacts). Crosstalk between pair conductors is then approximately proportional to the capacitance between pair conductors. We will let CXY be the crosstalk (roughly proportional to the capacitance between contacts) between conductor X and Y, so for pairs 1-2, 3-6 we have $$C23-C13+C16-C26 \text{ within de-embedded XTLK range of ANSI/TIA-568-C.2} \quad \text{(req. 1)}$$

and $$C23 \gg C13 \gg C26 \gg C16 \quad \text{(rel. 1)}$$

because of the relative distance between the conductors of pairs 1-2, 3-6. Relationship 1 (rel. 1) is indicative of an asymmetric crosstalk (coupling) as none of C23, C13, C26, and C16 are equal, and any plug meeting the requirements of ANSI/TIA-568-C.2 must conform to Requirement 1 (req. 1). Also, for the purpose of the following discussion, and because the coupling between contacts 2 and 3 dominate due to relative proximity, we will let $$C23-C13+C16-C26=C'23. \quad \text{(eq. 1)}$$

In contrast, the present invention has reduced crosstalk in the plug contact region due to the reduced contact areas, and also has reduced crosstalk due to the separation of insulation piercing features of the plug contacts into separate, new IDC elements which are connected to a PCB, and which IDC elements can be organized into a semi-balanced or balanced orientation as previously described. In the present invention, each of the new plug contacts' crosstalk couplings C"23, C"13, C"16, C"26 are individually less than their counterparts C23, C13, C16, C26, respectively, in the prior art plug. Consequently, when C"23, C"13, C"16, C"26 are substituted into Equation 1 (eq. 1), the left hand side of the equation is less that C'23, and Requirement 1 is also not met, i.e., C"23−C"13+C"16−C"26 can fall outside the de-embedded XTLK range of ANSI/TIA-568-C.2. C"23, C"13, C"16, C"26 still comprise asymmetric crosstalk (coupling) as they are not all equal. The reduction in the new plug contacts' crosstalks C"23, C"13, C"16, C"26 provides at least one design degree of freedom that is used advantageously in the present invention.

The present invention adds in an asymmetric crosstalk element C'''16 in the PCB such that C"23−C"13+C"16−C"26+C'''16 is within de-embedded XTLK range of ANSI/TIA-568-C.2. Further, the value of C'''16 is selected such that $$C''23-C''13+C''16-C''26=C'''23(\text{effective plug contact crosstalk})=C'''16. \quad \text{(eq. 2)}$$

C'''16 is a mirrored crosstalk element because C'''16 is placed between opposite contact conductors (1-6) when compared to the contact conductors (2-3) the new effective plug contact crosstalk C'''23 is effectively between. C'''16 is a second asymmetric coupling element in that the other inherent plug PCB coupling elements for this pair combination, which are due to the distributed electrical parameters of the PCB transmission lines, have a significantly lower value than C'''16. When C'''16 is combined with the inherent asymmetric coupling C'''23, a balanced symmetric coupling exists between the individual contacts of this pair combination because of the equality, or approximate equality, of Equation 2. There exists in the present invention a balanced symmetric coupling between the individual contacts for this pair combination leading to minimized mode conversion due to equal capacitive loading on each conductor of pair 1-2.

The same technique is applied on the PCB with respect to pair 1-2 and pair 4-5 (see component C'''15), pair 3-6 and pair 7-8 (see component C'''83), and pair 4-5 and pair 7-8 (see component C'''84). For pair combination 3-6, 4-5, it is a naturally balanced symmetric coupling because of the split pair 3-6 around pair 4-5; although coupling can be added between 3-4, and 5-6, in approximately equal amounts, if the level of the crosstalk for this pair combination needs to be raised to be within the de-embedded range. Pair combination 1-2, 7-8 is not of concern because of the separation between these pairs and the corresponding low levels of crosstalk. The balanced nature of the IDCs provides at least one design degree of freedom that is used advantageously in the present invention in that the IDC layout as previously described also reduces the inherent asymmetric coupling of the plug.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A communication plug for making electrical contact between a communication cable and a communication jack, comprising:
    a plug body having a cavity for receiving the communication cable, wherein the communication cable enters the plug body along an axis;
    a molded body contained within the plug cavity;
    a circuit board wrapped around the body;
    first contacts for making electrical contact between traces on the circuit board and the cable; and
    second contacts for making electrical contact between the traces on the circuit board and contacts on a jack to which the plug is interfaced.

2. The communication plug of claim 1, wherein the circuit board is a flexible printed circuit board.

3. The communication plug of claim 2, wherein the molded body has a generally triangular cross-section, and wherein the flexible circuit board is wrapped around the body so that first and second ends of the flexible circuit board are located in the plug body closest to where the communication cable enters the cavity.

4. The communication plug of claim 3, wherein a first subset of IDCs are press-fit into holes in the body at the first end of the circuit board and second subset of IDCs are press-fit into holes in the body at the second end of the circuit board, and wherein the first and second subsets of IDCs make electrical contact with wires in the communication cable and with traces on the circuit board.

5. The communication plug of claim 1, wherein the second contacts are contact pads disposed on the circuit board.

6. The communication plug of claim 1, wherein the circuit board comprises a common mode choke for each pair of the traces on the circuit board.

7. The communication plug of claim 1, wherein the circuit board comprises a plurality of surface mount chokes positioned in pockets in the body.

* * * * *